(12) United States Patent
Mascolo et al.

(10) Patent No.: US 7,867,402 B2
(45) Date of Patent: Jan. 11, 2011

(54) METHOD FOR REALIZING A MULTISPACER STRUCTURE, USE OF SAID STRUCTURE AS A MOLD AND CIRCUITAL ARCHITECTURES OBTAINED FROM SAID MOLD

(75) Inventors: Danilo Mascolo, Ercolano (IT); Gianfranco Cerofolini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1133 days.

(21) Appl. No.: 11/539,015

(22) Filed: Oct. 5, 2006

(65) Prior Publication Data
US 2007/0148975 A1    Jun. 28, 2007

(30) Foreign Application Priority Data
Oct. 6, 2005    (EP)    ................... 05425698

(51) Int. Cl.
*H01L 21/302* (2006.01)
*B82B 3/00* (2006.01)

(52) U.S. Cl. ............... 216/11; 216/13; 216/15; 216/39; 216/41; 216/46; 216/52; 216/79; 216/83; 216/88; 438/696; 438/700; 438/703; 438/946; 438/947; 264/293; 977/887; 977/888

(58) Field of Classification Search ............ None
See application file for complete search history.

(56) References Cited

U.S. PATENT DOCUMENTS

| | | | |
|---|---|---|---|
| 5,688,723 A | 11/1997 | Okamoto et al. | ............ 437/228 |
| 5,916,821 A * | 6/1999 | Kerber | ............ 438/696 |
| 6,128,214 A | 10/2000 | Kuekes et al. | ............ 365/151 |
| 6,743,368 B2 * | 6/2004 | Lee | ............ 216/2 |
| 6,872,647 B1 * | 3/2005 | Yu et al. | ............ 438/585 |

(Continued)

FOREIGN PATENT DOCUMENTS

EP    1 333 324 A2    8/2003

(Continued)

OTHER PUBLICATIONS

M.D. Austin et al., "6 nm half-pitch lines and 0.04 μm² static random access memory patterns by nanoimprint lithography," *Nanotechnology*, vol. 16, 2005, pp. 1058-1061, May 2005.

(Continued)

*Primary Examiner*—Anita K Alanko
(74) *Attorney, Agent, or Firm*—Lisa K. Jorgenson; Robert Iannucci; Seed IP Law Group PLLC

(57) ABSTRACT

A method realizes a multispacer structure including an array of spacers having same height. The method includes realizing, on a substrate, a sacrificial layer of a first material; b) realizing, on the sacrificial layer, a sequence of mask spacers obtained by S"PT, which are alternately obtained in at least two different materials; c) chemically etching one of the two different materials with selective removal of the mask spacers of this etched material and partial exposure of the sacrificial layer; d) chemically and/or anisotropically etching the first material with selective removal of the exposed portions of the sacrificial layer; e) chemically etching the other one of the two different materials with selective removal of the mask spacers of this etched material and obtainment of the multispacer structure.

24 Claims, 25 Drawing Sheets

U.S. PATENT DOCUMENTS

| | | | |
|---|---|---|---|
| 7,256,131 B2* | 8/2007 | LaBrake | 438/710 |
| 7,368,395 B2* | 5/2008 | Islam et al. | 438/738 |
| 7,432,120 B2* | 10/2008 | Mascolo et al. | 438/42 |
| 7,449,348 B1* | 11/2008 | Dakshina-Murthy et al. | 438/7 |
| 7,456,508 B2* | 11/2008 | Mascolo et al. | 257/331 |
| 7,462,292 B2* | 12/2008 | Lee | 216/54 |
| 7,492,624 B2* | 2/2009 | Mascolo et al. | 365/151 |
| 7,579,278 B2* | 8/2009 | Sandhu | 438/689 |
| 7,605,066 B2* | 10/2009 | Cerofolini et al. | 438/584 |
| 2003/0003775 A1 | 1/2003 | Chen | 438/800 |
| 2003/0141276 A1 | 7/2003 | Lee | 216/8 |
| 2003/0205658 A1 | 11/2003 | Voisin | 249/187.1 |
| 2004/0155011 A1 | 8/2004 | Hareland et al. | |
| 2007/0065990 A1* | 3/2007 | Degroote et al. | 438/142 |
| 2008/0246158 A1 | 10/2008 | Mascolo et al. | |
| 2008/0286449 A1* | 11/2008 | Park | 427/123 |
| 2009/0310256 A1* | 12/2009 | Albrecht et al. | 360/135 |

FOREIGN PATENT DOCUMENTS

| | | |
|---|---|---|
| EP | 1 357 433 | 10/2003 |
| WO | 2006/090417 A1 | 8/2006 |

OTHER PUBLICATIONS

G.F. Cerofolini et al., "A hybrid approach to nanoelectronics," *Nanotechnology*, vol. 16, 2005, pp. 1040-1047, May 2005.

G.F. Cerofolini et al., "Strategies for nanoelectronics," *Microelectronic Engineering*, vol. 81, 2005, pp. 405-419, Apr. 2005.

D.C. Flanders et al., "Generation of <50 nm period gratings using edge defined techniques," *J. Vac. Sci. Technol.*, B 1(4), Oct.-Dec. 1983, pp. 1105-1108.

N.A. Melosh et al., "Ultrahigh-Density Nanowire Lattices and Circuits," *Science*, vol. 300, Apr. 4, 2003, pp. 112-115.

Chen, Y. et al., "Nanoscale molecular-switch crossbar circuits," Nanotechnology 14, pp. 462-468, 2003, published online Mar. 20, 2003.

Chen, Y. et al., "Nanoscale molecular-switch devices fabricated by imprint lithography," Applied Physics Letters 82 (10):1610-1612, Mar. 10, 2003.

Choi, Y. et al., "Sub-Lithographic Patterning Technology for Nanowire Model Catalysts and DNA Label-Free Hybridization Detection," Proceedings of SPIE Nanofabrication Technologies, vol. 5220, pp. 10-19, 2003.

Nasrullah, J. et al., "An Edge-Defined Nano-Lithography Technique Suitable for Low Thermal Budget Process and 3-D Stackable Devices," IEEE, pp. 502-505, 2003.

* cited by examiner

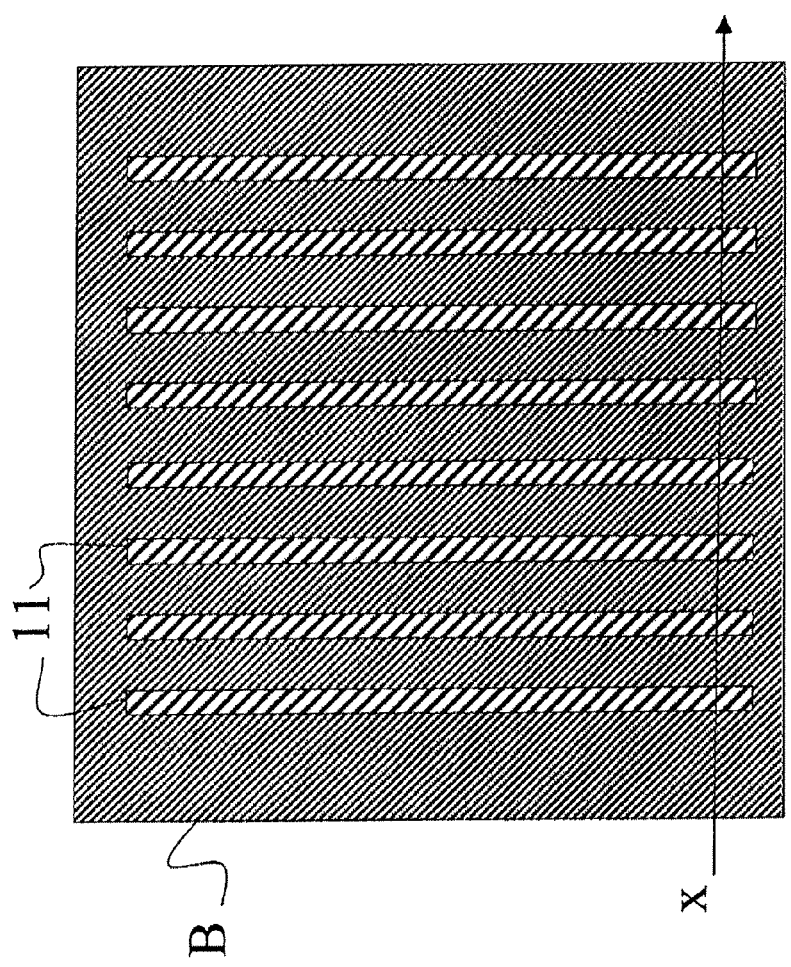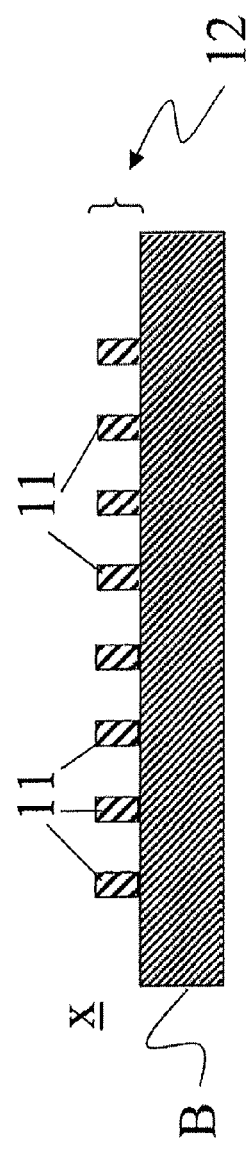

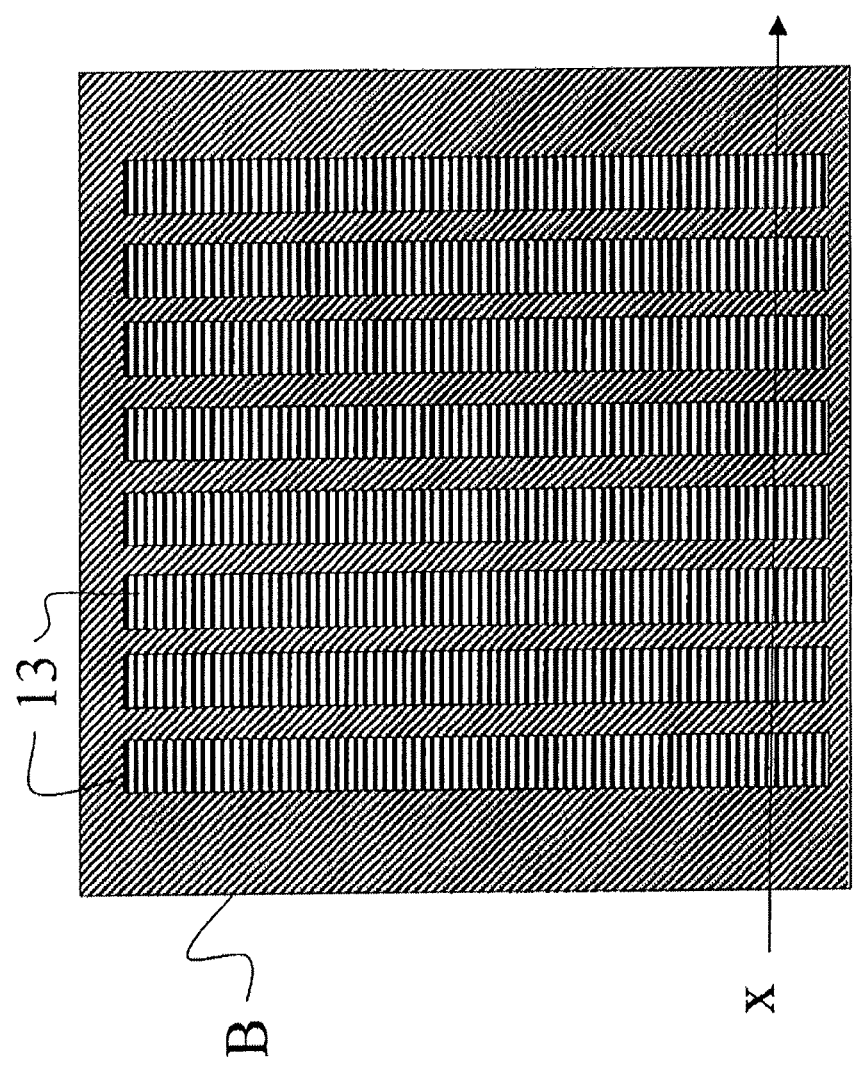
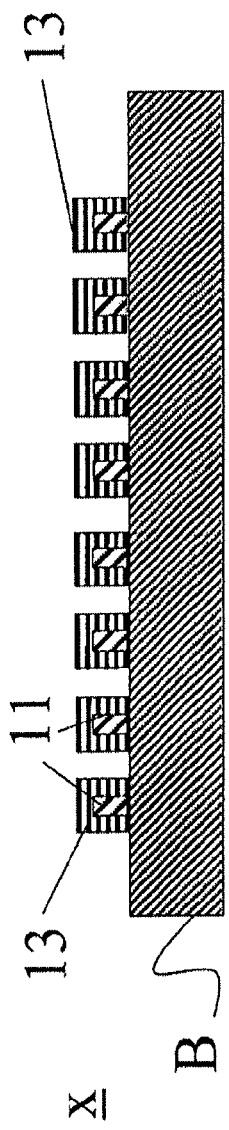

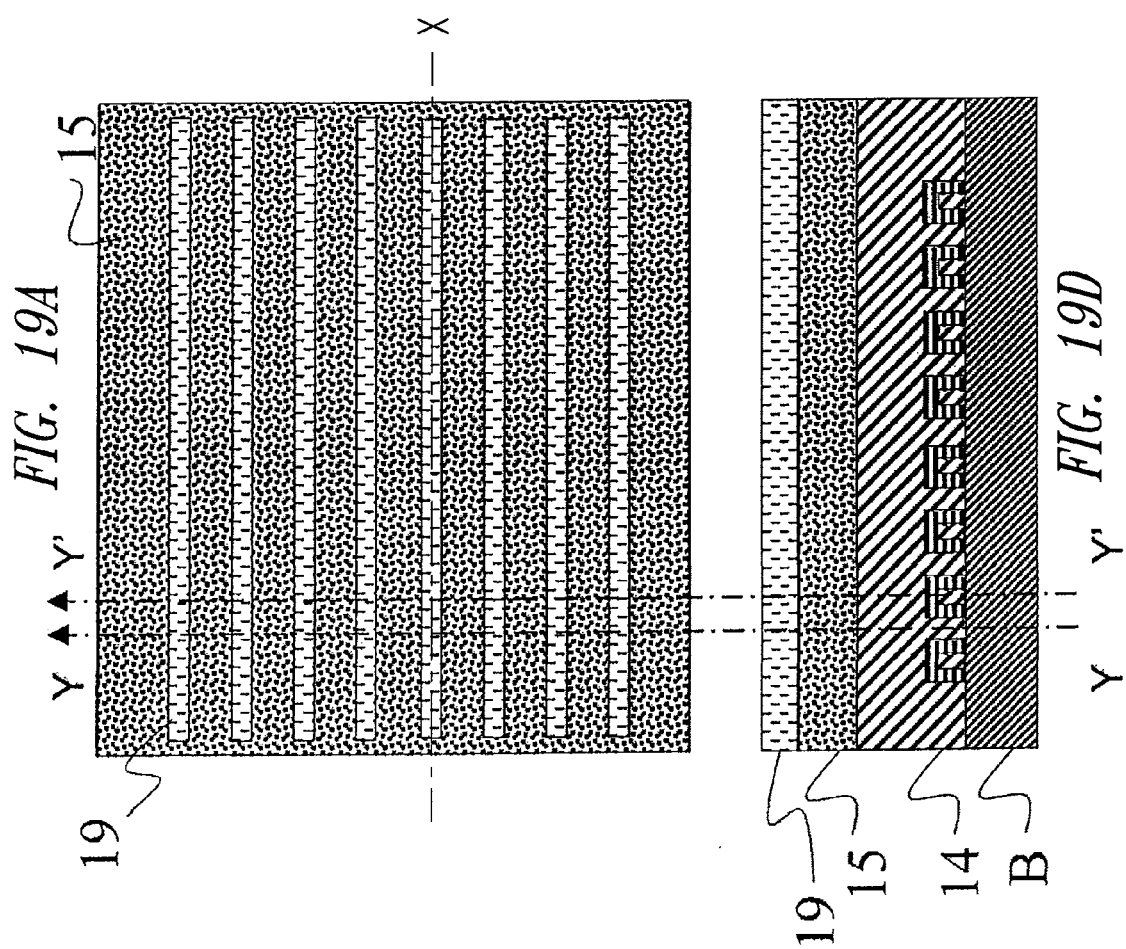
FIG. 19A
FIG. 19D
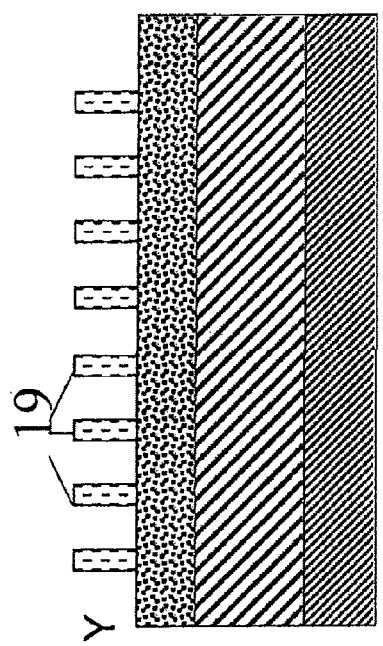
FIG. 19B
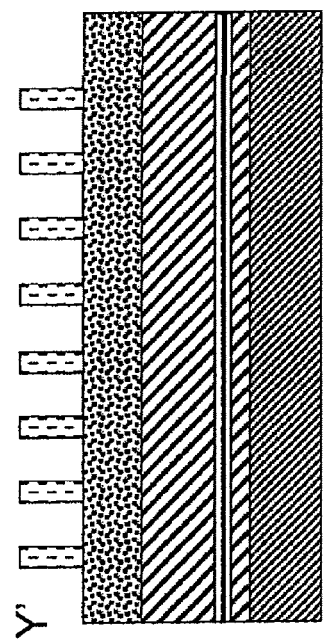
FIG. 19C

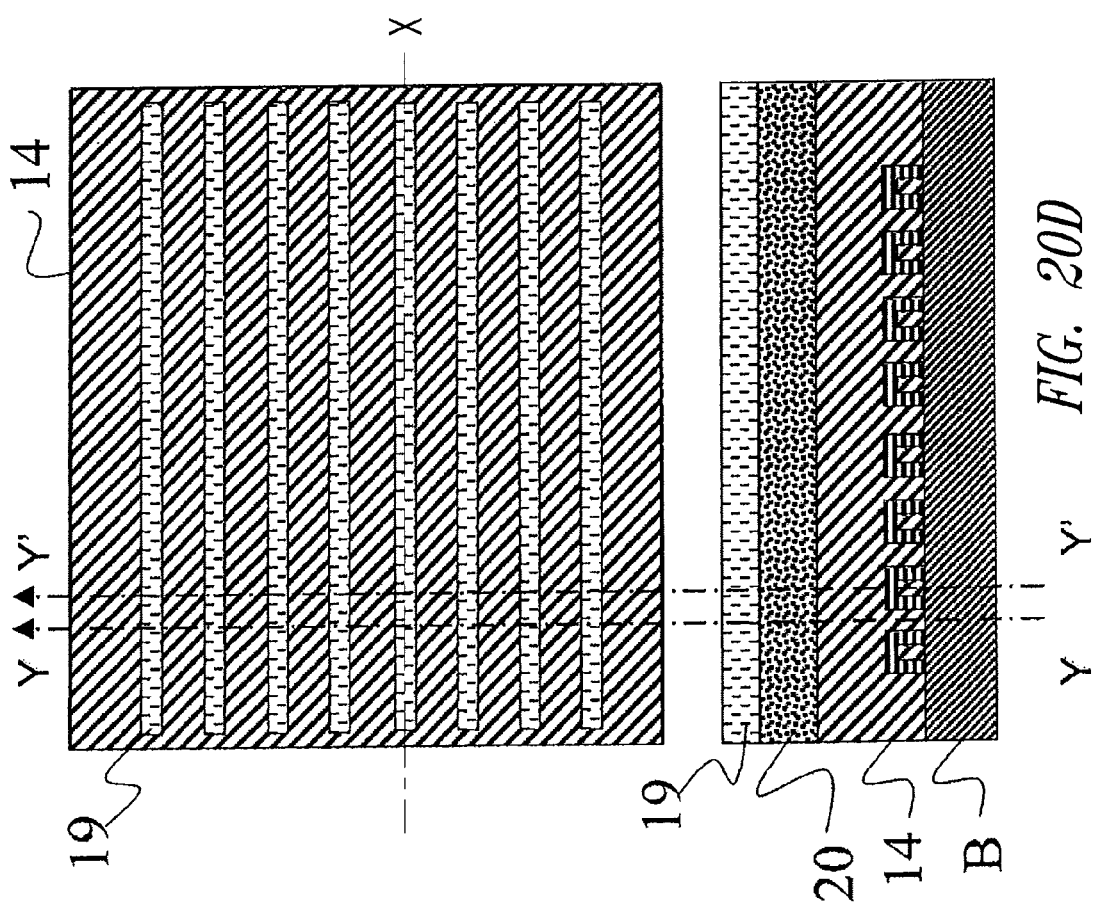
FIG. 20A
FIG. 20D
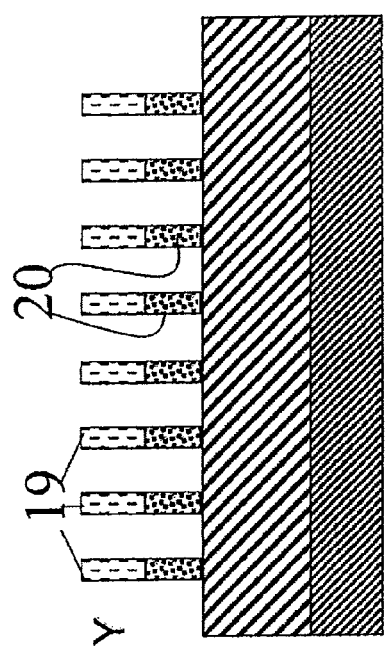
FIG. 20B
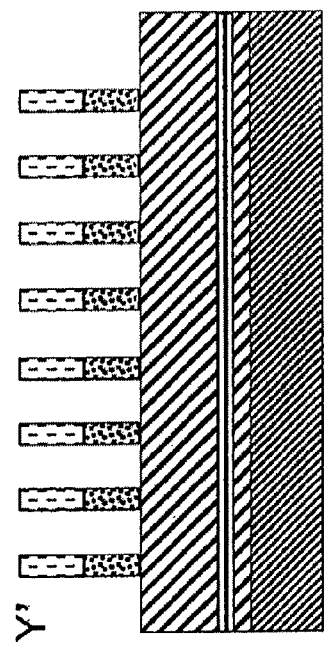
FIG. 20C

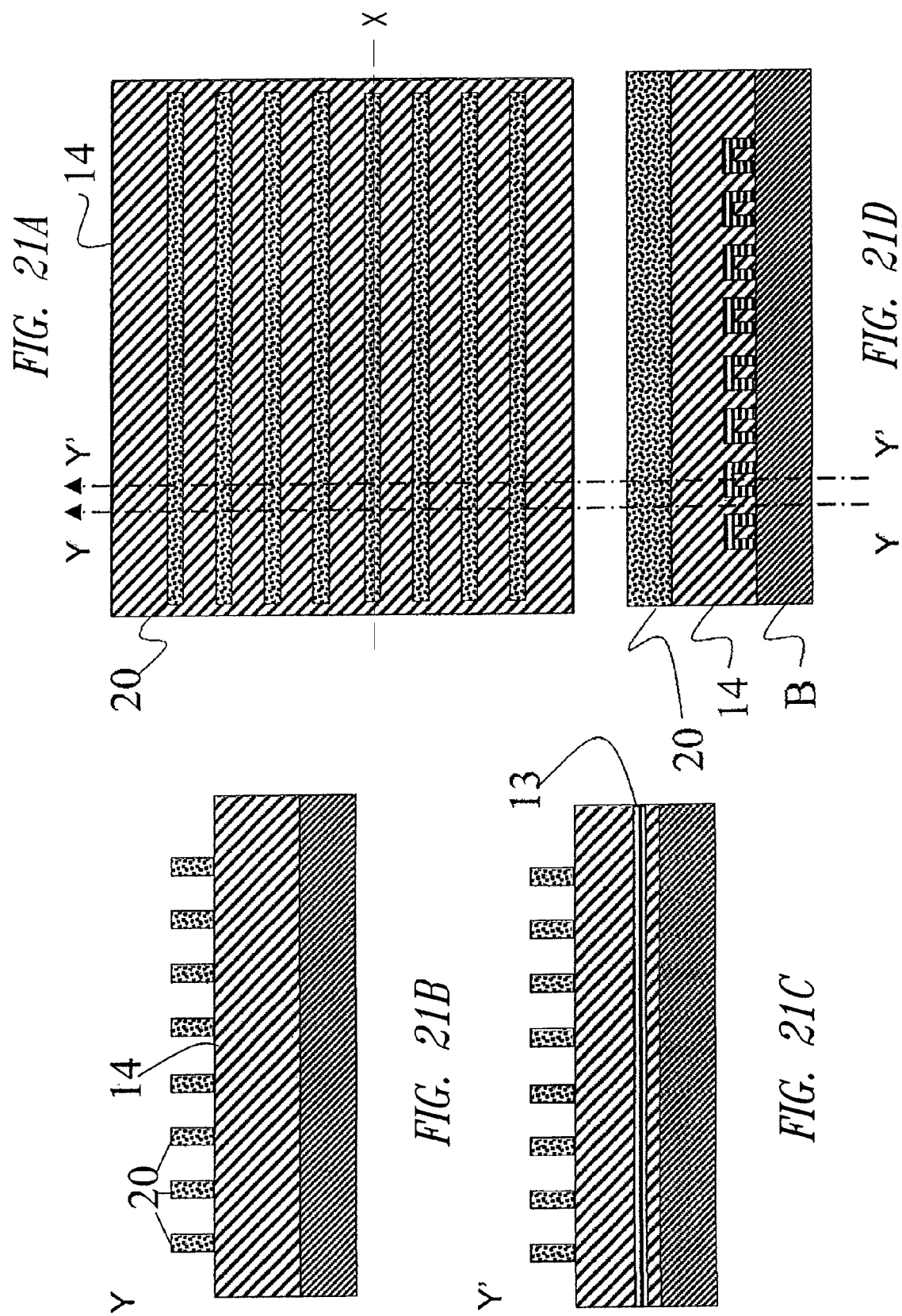

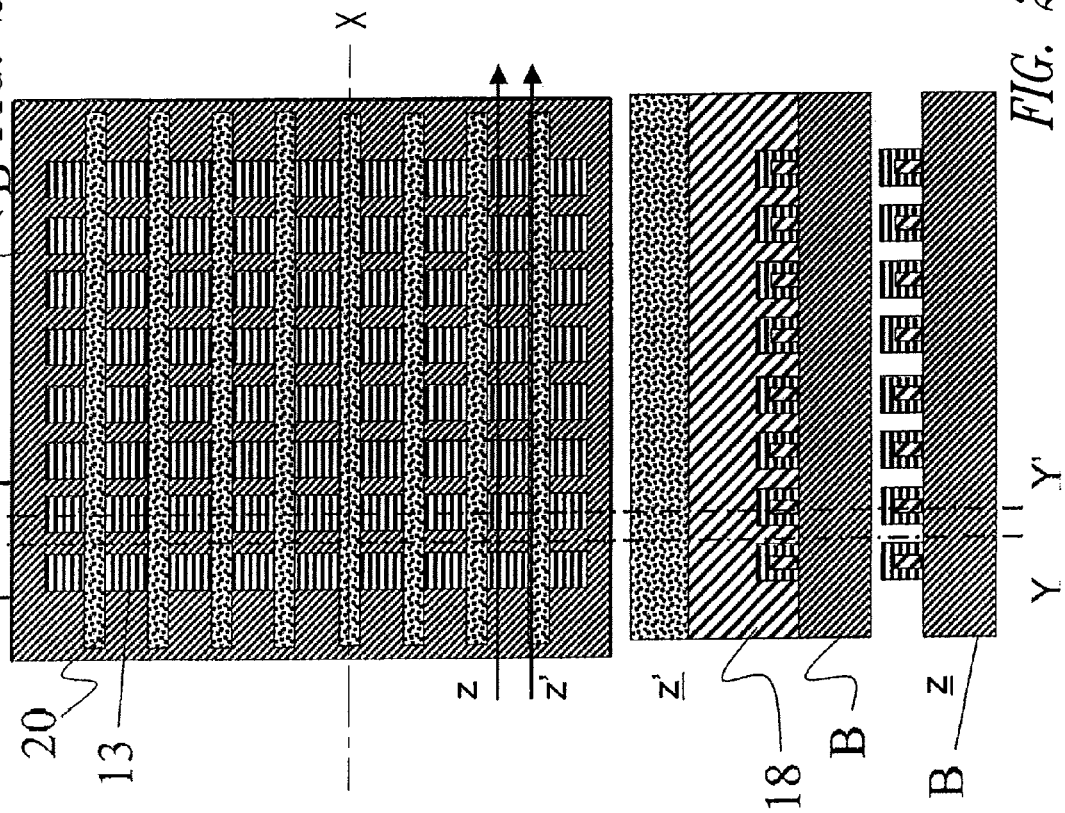
FIG. 22A
FIG. 22D
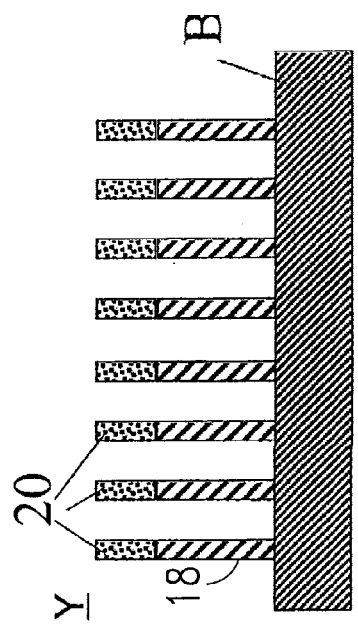
FIG. 22B
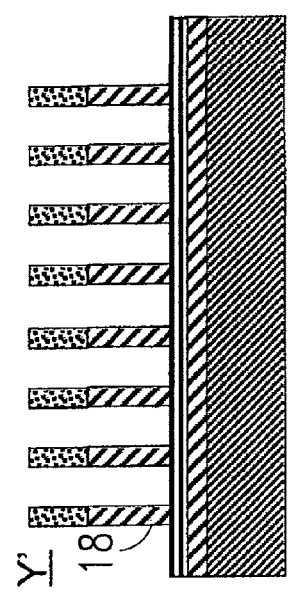
FIG. 22C

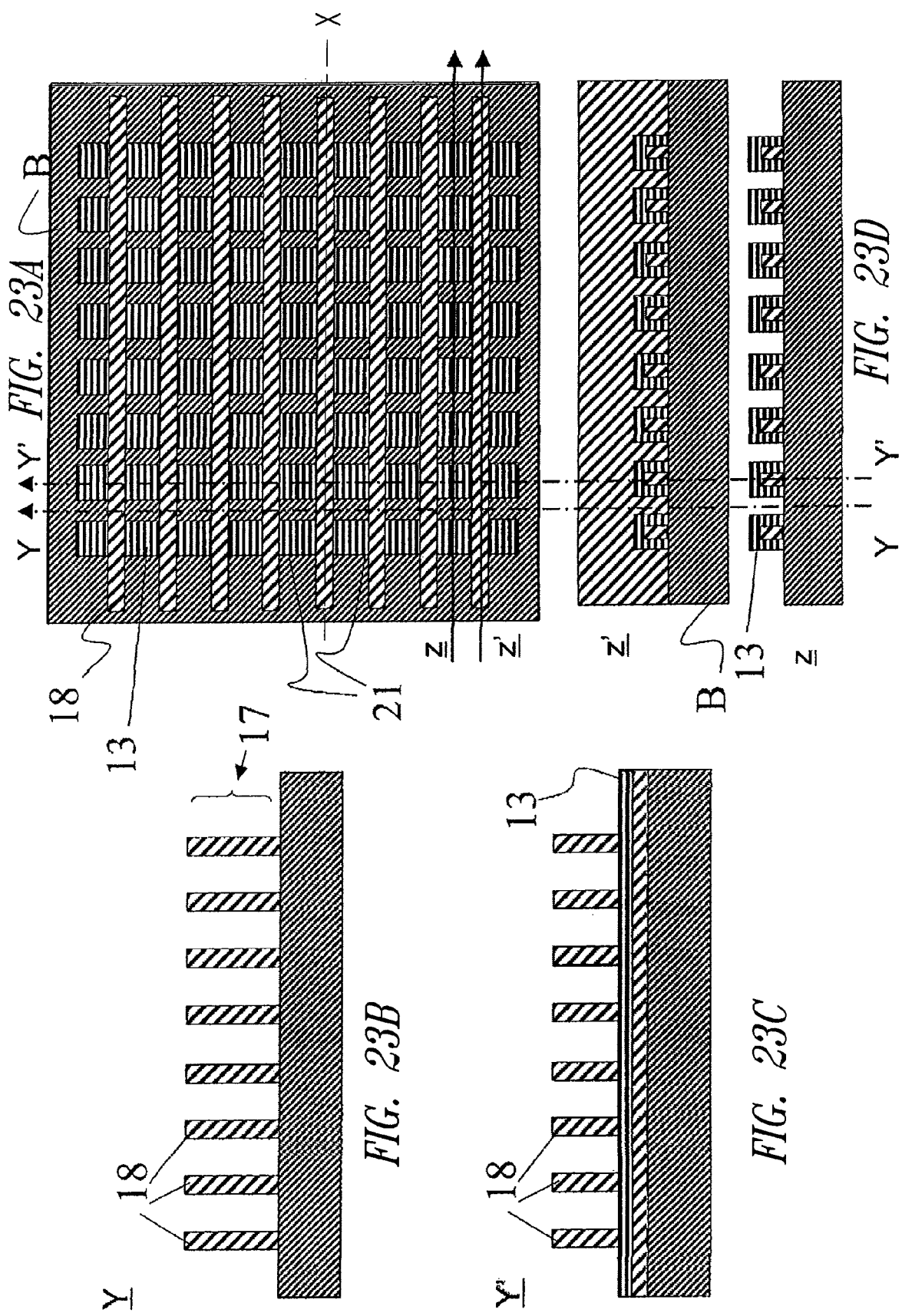

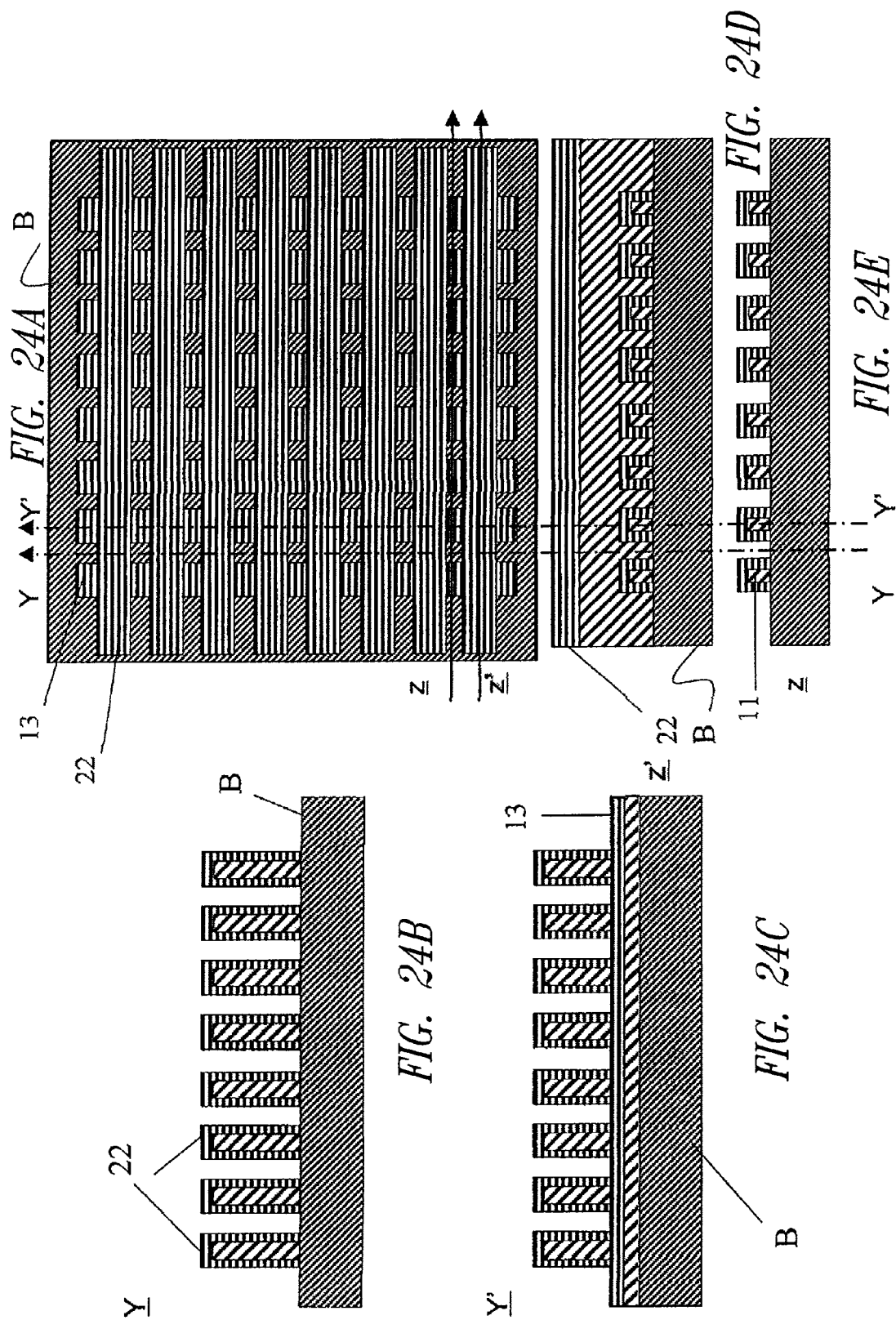

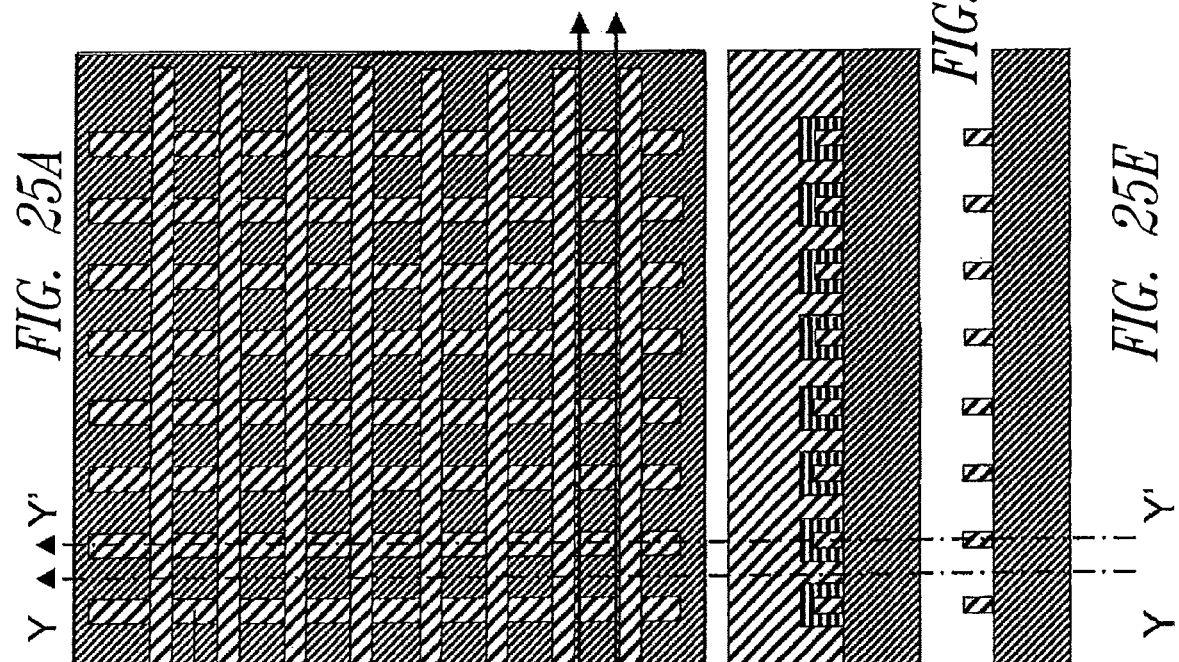
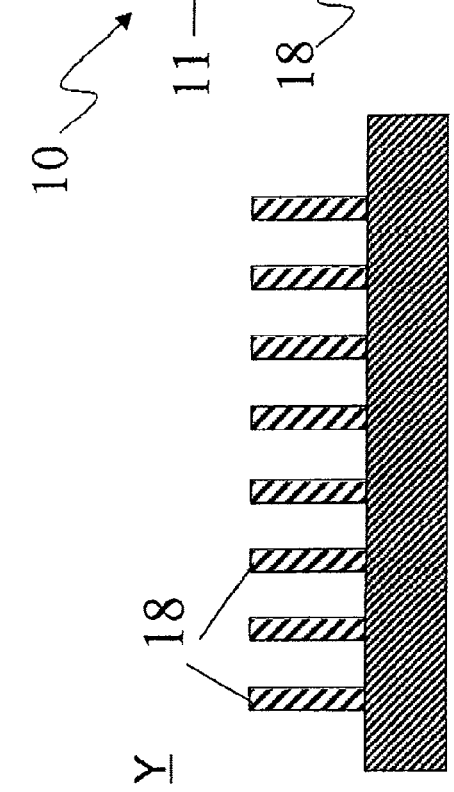
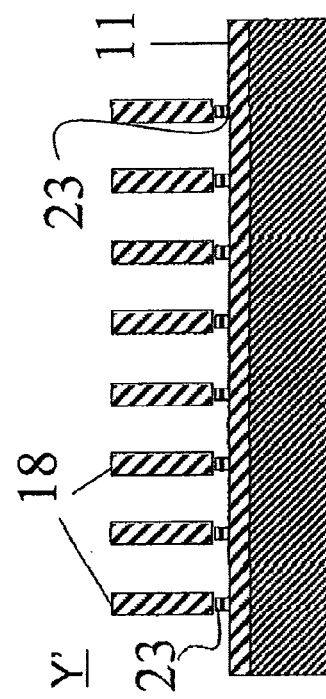
FIG. 25A
FIG. 25B
FIG. 25C
FIG. 25D
FIG. 25E

METHOD FOR REALIZING A MULTISPACER STRUCTURE, USE OF SAID STRUCTURE AS A MOLD AND CIRCUITAL ARCHITECTURES OBTAINED FROM SAID MOLD

BACKGROUND OF THE INVENTION

1. Field of the Invention

The present invention relates, in its most general aspect, to the field of the electronics comprising nanometric components and to the nano-manufacturing field.

In particular, the invention relates to a method for realizing a multispacer structure, particularly but not exclusively indicated to be employed as mold in imprint lithography processes in the realization of nanometric circuit architectures.

The invention also relates to a nanometric circuit architecture obtained by means of the above mold.

2. Description of the Related Art

As it is well known, in the field of the electronics, the need of realizing circuit configurations of more and more reduced sizes is particularly felt.

The known technique to meet this need has provided non-photolithographic methods such as, for example, electronic lithography and lithography with X rays, known as lithographic techniques of new generation (NGL—Next generation lithography) and imprint lithography processes.

With these techniques it is possible to realize structures in the nanometric scale (NLS—nanometer length scale), for example to miniaturize crossbar circuit structures up to a density of intersection points of $10^{11}$ $cm^{-2}$, or to obtain highly thickened periodical structures such as arrays having a period lower than 30 nm.

Some examples of these realizations are reported in the publication by N. A. Melosh, A. Boukai, F. Diana, B. Gerardot, A. Badolato, and J. R. Heath, "Ultra High Density Nanowire Lattices and Circuits", Science 300, 112 (2003) and in the one by M. D. Austin, W. Zhang, H. Ge, D. Wasserman, S. A. Lyon and S. Y. Chou. "6 nm Half-Pitch Lines and 0.04 µM2 Static Random Access Memory Patterns by Nanoimprint Lithography", Nanotechnology 16, 1058-1061 (2005). A further example is disclosed in the U.S. Pat. No. 6,128,214 by P J. Kuekes et al.

Although advantageous, the lithography with X rays and the electronic one are not exempt from drawbacks such as mainly the need to operate with expensive and complex instruments characterized, moreover, by particularly long etching times.

On the contrary, the imprint lithography processes, which are based on the use of a mold through which a polymer deposited on a substrate is mechanically deformed, are quick and economical.

However, molds with high resolution are generally obtained by using the same electronic lithography with subsequent limitation of the above advantages of the imprint lithography techniques.

Methods are also known based on the Multi-Spacer Patterning Technology (MSPT or S"PT) which are improving with respect to the most advanced lithographic techniques in the realization of repetitive nanometric architectures.

Some examples of these applications are disclosed in the publications "Strategies for Nanoelectronics", Micr. Eng. 81 (2005) 405-419 (Aug. 8, 2005) and "A Hybrid Approach to Nanoelectronics", Nanotech. 16 (2005) 1040-1047.

The use of the S"PT for the direct realization of circuit architectures or of structures to be employed as mold in imprint lithography processes is advantageous since this technique has proved to be economical and of simple realization, moreover it allows the attainment of highly critical sizes, in the order of a few nanometers.

However, also the S"PT is not exempt from drawbacks among which the main one is in a non-uniform size of the nanometric spacers obtained, as shown in the electronic micrography of FIG. 1 and in the relative schematic representation of FIG. 2.

In particular, FIG. 2 shows a structure 50 comprising an array of spacers 60 whose height decreases passing from end portions towards the center of the structure itself, i.e., as long as the spacers are obtained at increasing distance from the seed 70.

The above drawback is in reality a serious limitation for these structures, considering that in the electronic nano-manufacturing field the precision and the control of the sizes are very important.

BRIEF SUMMARY OF THE INVENTION

One embodiment of the invention is a method for realizing a structure comprising an array of spacers having such characteristics as to completely overcome the drawbacks previously cited with reference to the prior art.

In particular, such a method realizes a multispacer structure wherein the above array comprises spacers having substantially the same height.

The method allows the attainment of nanometric sizes, allowing to realize these multispacer structures with repetition period in the order of a few units of nanometers.

The method is quick and economical and allows the realization of multispacer structures of the above considered type which are, moreover, particularly indicated to be employed as mold in imprint lithography processes.

One embodiment of the invention also relates to the use, as mold, of a multispacer structure obtained with the above considered method.

The characteristics and advantages of the present invention will be apparent from the following description of an embodiment thereof given by way of indicative and non-limiting example with reference of the annexed drawings.

BRIEF DESCRIPTION OF THE SEVERAL VIEWS OF THE DRAWINGS

In these drawings:

FIG. 14A shows a plan view of a step of realizing an array of nanowires of a crossbar circuit architecture obtained by using, as mold, the multispacer structure of FIG. 9, according to another aspect of the invention;

FIG. 14B shows a section view along section line X of the array of nanowires of FIG. 14A;

FIG. 15A shows a plan view of a first insulating layer realized on the array of nanowires of FIG. 14A;

FIG. 15B shows a section view along section line X of the first insulating layer of FIG. 15A;

FIG. 19A shows the crossbar architecture of FIGS. 14-18 in plan view of a step of realizing a plurality of mask spacers from the mask layer of FIG. 18A;

FIG. 19B shows a section view along section line Y of the plurality of mask spacers of FIG. 19A;

FIG. 19C shows a section view along section line Y' of the plurality of mask spacers of FIG. 19A;

FIG. 19D shows a section view along section line X of the plurality of mask spacers of FIG. 19A;

FIG. 20A shows a plan view of a step of realizing a plurality of second mask insulating spacers from the third insulating layer;

FIG. 20B shows a section view along section line Y of the plurality of second mask insulating spacers of FIG. 20A;

FIG. 20C shows a section view along section line Y' of the plurality of second mask insulating spacers of FIG. 20A;

FIG. 20D shows a section view along section line X of the plurality of second mask insulating spacers of FIG. 20A;

FIG. 21A shows a plan view of a step of removing the plurality of mask spacers realized in FIG. 19A;

FIG. 21B shows a section view along section line Y of FIG. 21A;

FIG. 21C shows a section view along section line Y' of FIG. 21A;

FIG. 21D shows a section view along section line X of FIG. 21A;

FIG. 22A shows a further realization step of realizing a second array of conductive spacers of the above crossbar architecture in plan view;

FIG. 22B shows a section view along section line Y of FIG. 22A;

FIG. 22C shows a section view along section line Y' of FIG. 22A;

FIG. 22D shows a section view along section line X of FIG. 22A;

FIG. 23A shows a plan view of a step of removing the second mask insulating spacers realized in FIG. 20A;

FIG. 23B shows a section view along section line Y of FIG. 23A;

FIG. 23C shows a section view along section line Y' of FIG. 23A;

FIG. 23D shows a section view along section line X of FIG. 23A;

FIG. 24A shows a plan view of a step of realizing a second insulating layer on the second array of conductive spacers;

FIG. 24B shows a section view along section line Y of FIG. 24A;

FIG. 24C shows a section view along section line Y' of FIG. 24A;

FIG. 24D shows a section view along section line Z' of FIG. 24A;

FIG. 24E shows a section view along section line Z of FIG. 24A;

FIG. 25A shows a plan view of a step of realizing substantially rectangular section recesses by removing the second insulating layer and a portion of the first insulation layer;

FIG. 25B shows a section view along section line Y of FIG. 25A;

FIG. 25C shows a section view along section line Y' of FIG. 25A;

FIG. 25D shows a section view along section line Z' of FIG. 25A;

FIG. 25E shows a section view along section line Z of FIG. 25A.

DETAILED DESCRIPTION OF THE INVENTION

Figure 1:
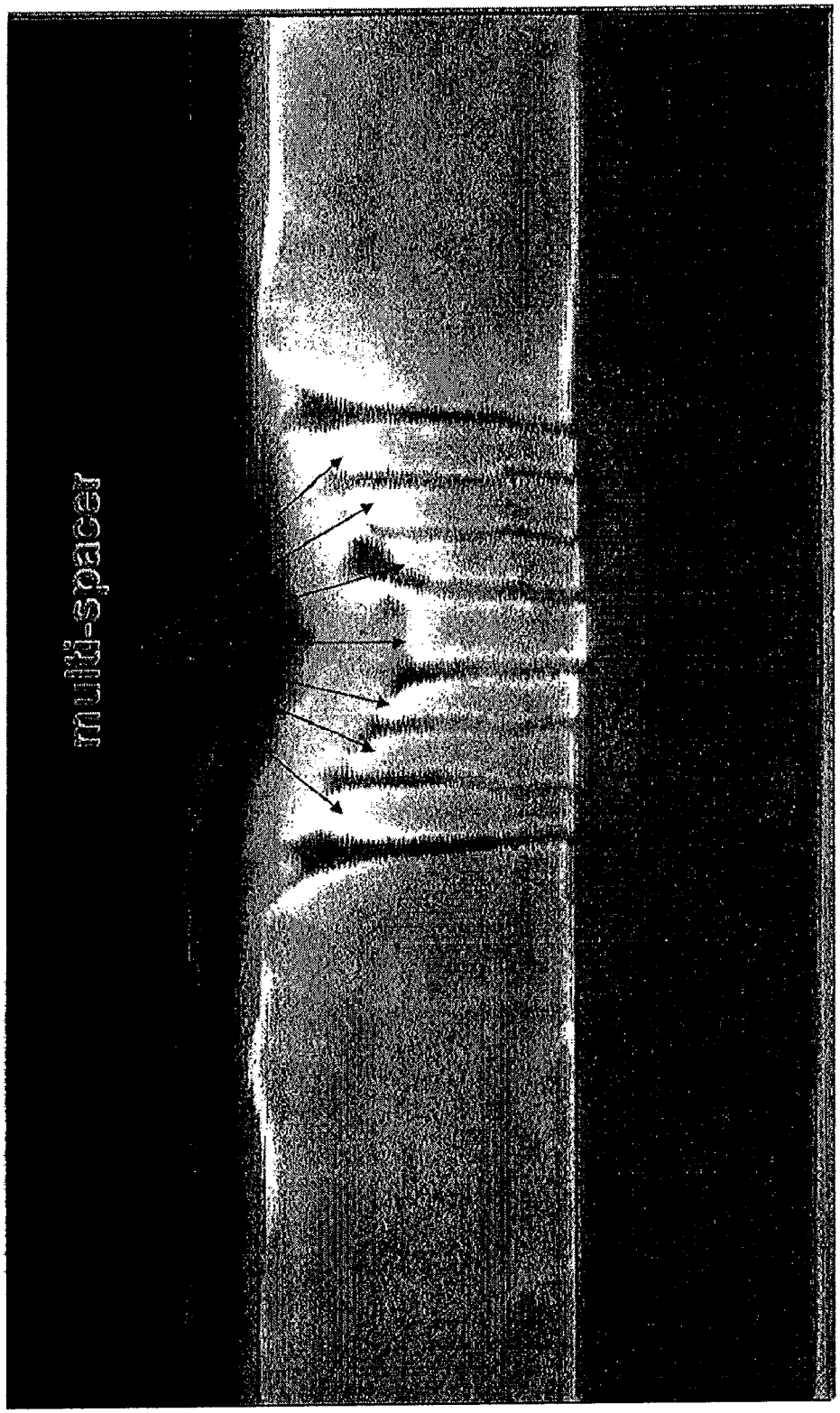
FIG. 1 shows an electronic micrography of a multispacer structure obtained with the S"PT technique according to the prior art.
Figure 2:
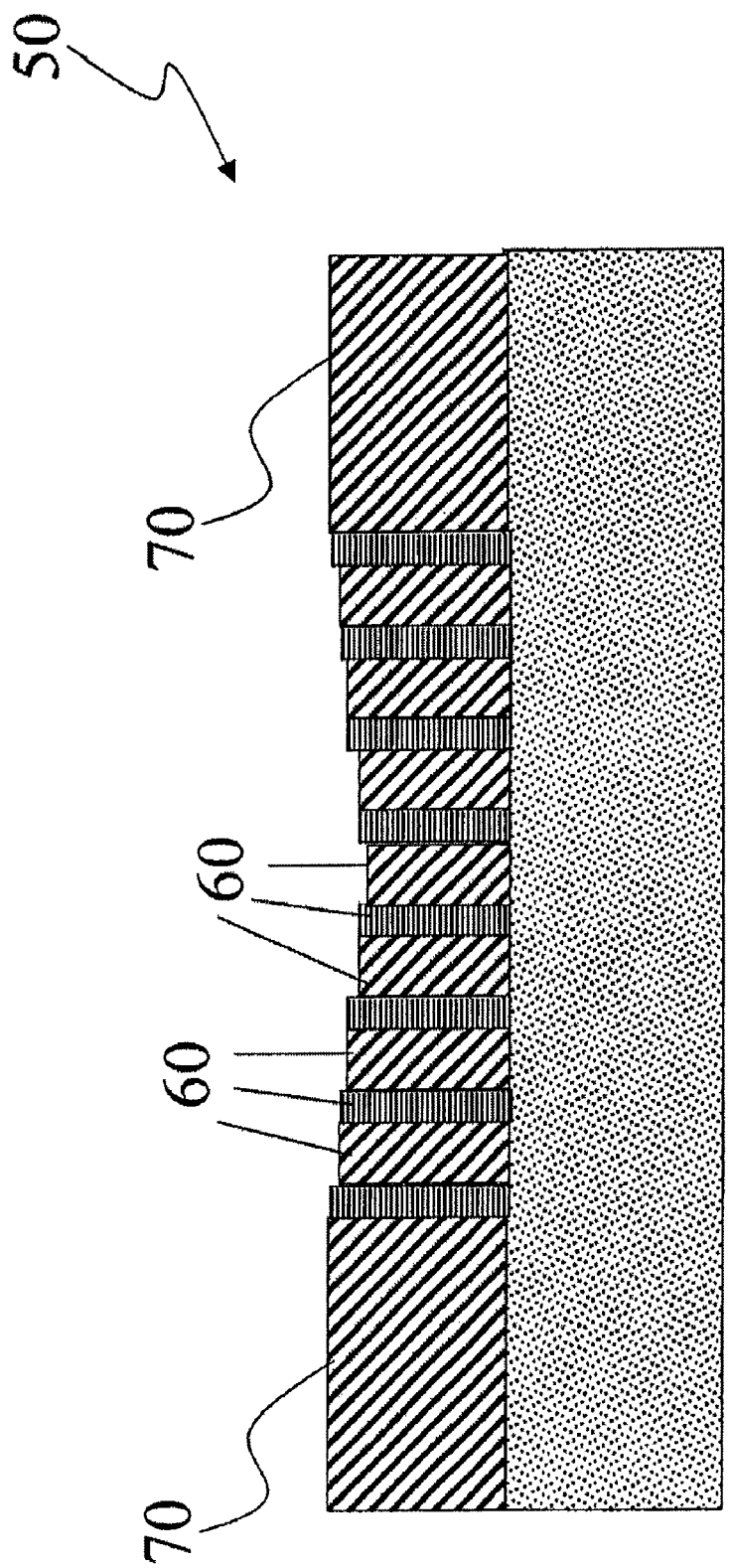
FIG. 2 schematically shows the multispacer structure of FIG. 1.
Figure 3:
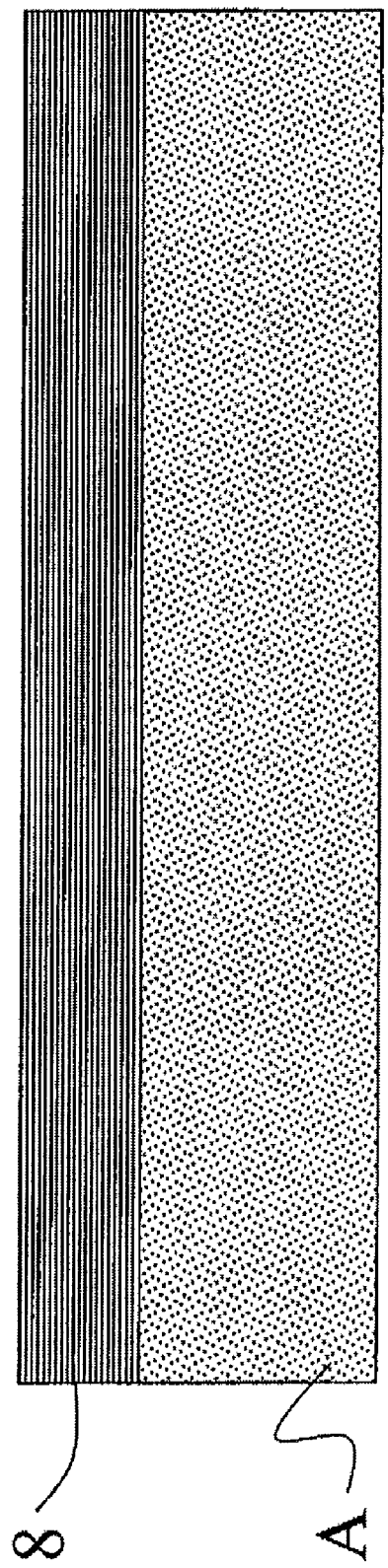
FIG. 3 shows a realization step of forming a bottom layer on a substrate of a multispacer structure obtained with the method according to the disclosure.
Figure 4:
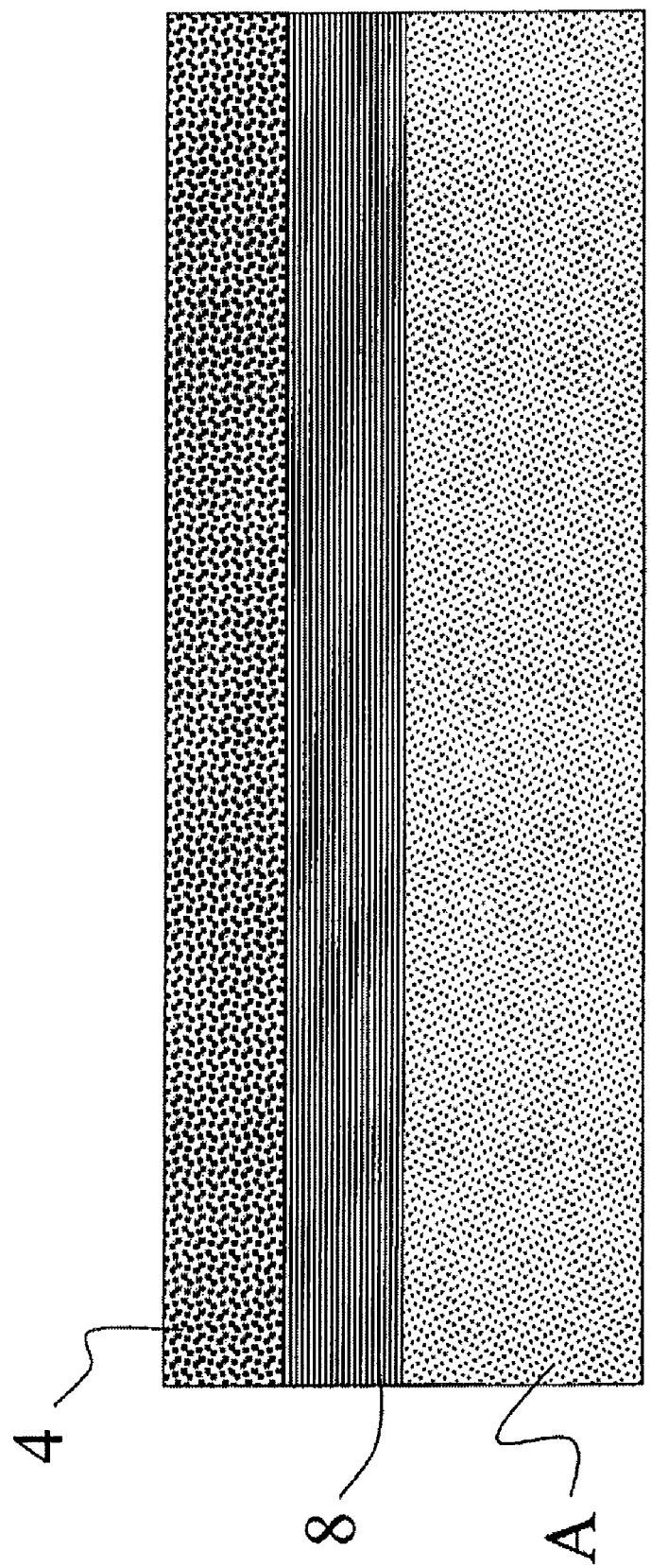
FIG. 4 shows a step of forming sacrificial layer on the bottom layer of FIG. 3.

It is worth noting that the above figures are not drawn to scale but they are realized so as to emphasize the characteristics of the invention which, advantageously, can be put into practice by using some of the usual techniques used in the nano-manufacturing field, in particular the Multi-Spacer Patterning Technology (S"PT) and the imprint lithography, as it will be more apparent hereafter in the description.

Now, with particular reference to FIGS. 3 to 9 a method is described according to one embodiment for realizing a multispacer structure globally indicated with 1.

In particular, the multispacer structure 1 comprises a plurality of spacers 2, or arrays 3 of spacers, essentially having same height.

To obtain the multispacer structure 1 first, on a substrate A, for example a silicon substrate, a sacrificial layer 4 of a first material is realized.

Above the sacrificial layer 4 a sequence of mask spacers 5 is then defined being alternated and adjacent to mask spacers 6, wherein the mask spacers 5, 6 are realized in the shape of a bar in at least two different materials.

These mask spacers 5, 6 are realized in a per se known way by the Multi-Spacer Patterning Technology through the repetition of a step comprising the controlled deposition of a layer of one of said two different materials, followed by an anisotropic etching of the layer deposited.

The mask spacers 5, 6 are obtained with a height comprised between 100 and 200 nm from at least one seed-block 7, comprising a wall substantially perpendicular to the sacrificial layer 4, deposited and defined on this latter in a conventional way.

In particular with reference to the example of the figures, the mask spacers 5, 6 are obtained, to realize a single body, starting from two seed-blocks 7 having respective perpendicular walls that are opposed to one another.

A chemical etching step follows being selective against one of these two different materials with subsequent removal of the mask spacers of this material, for example of the mask spacers 5 (FIG. 7) and partial exposure of the underlying sacrificial layer 4.

Thus, a further chemical and/or anisotropic selective etching step against the sacrificial layer 4 removes the exposed portions thereof, i.e., the portions of sacrificial layer 4 which are not covered and protected by the remaining mask spacers 6.

Finally, also the mask spacers 6 and the seed-blocks 7 are removed, still by selective chemical etching, with obtainment of the multispacer structure 1.

In particular, the multispacer structure 1 shows itself as a structure with notched profile, comprising a plurality of spacers 2 parallel to each other and equidistant, advantageously having substantially the same height corresponding to the height of the sacrificial layer 4.

More in particular, the spacers 2 have the same width as that of the mask spacers 6 used to protect the sacrificial layer 4, while their distance, which determines corresponding slots 2a in the multispacer structure 1, corresponds to the width of the mask spacers 5 initially removed.

As regards the materials used in the present method, it is to be said that the above first material is preferably silicon nitride deposited to form the sacrificial layer 4 with a height comprised between 2 and 100 nm.

The mask spacers 5, 6 of two different materials are instead respectively realized in silicon oxide with width comprised between 1 and 100 nm and in polysilicon with width comprised between 5 and 30 nm, the possibility of using further different materials not being excluded.

Figure 5:
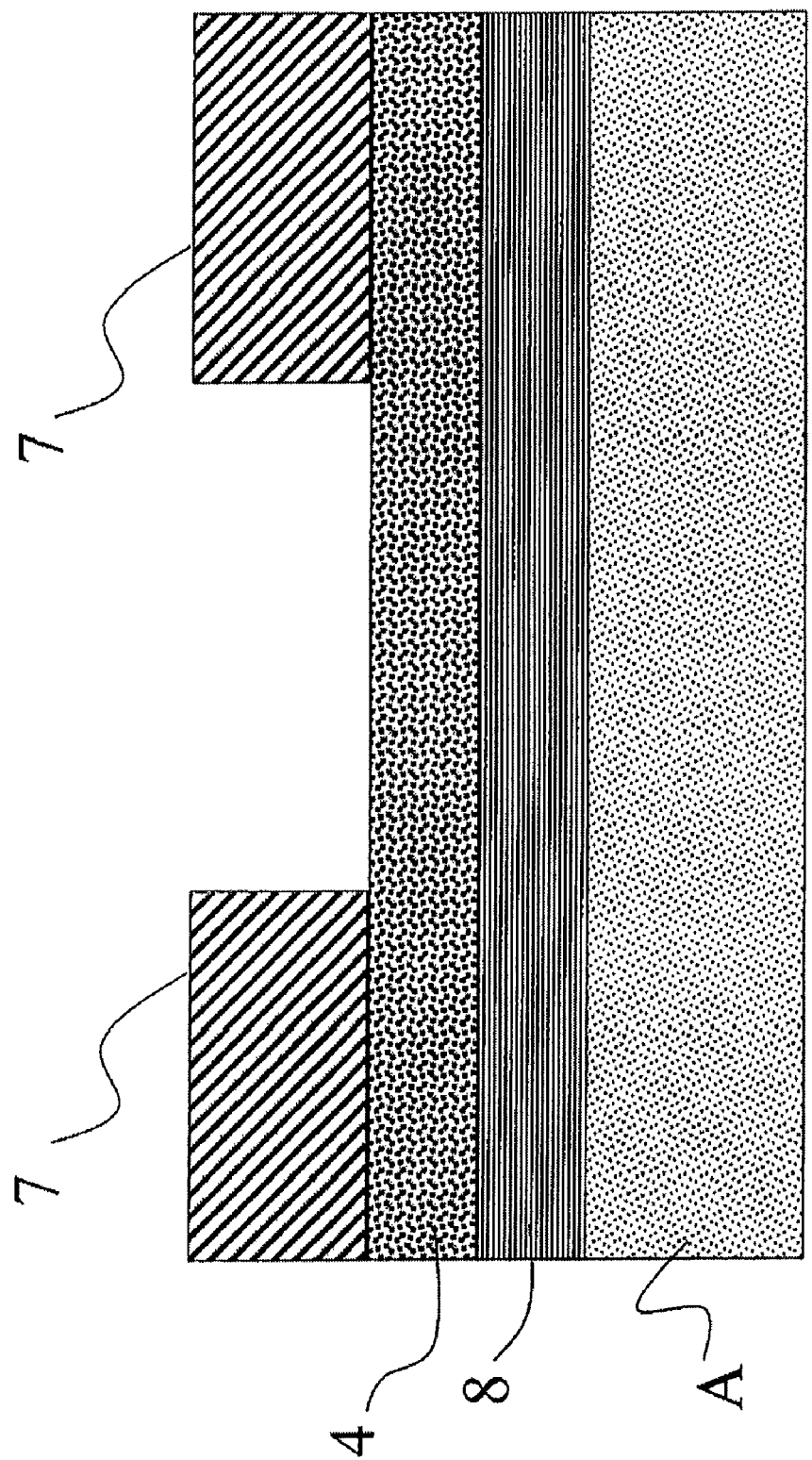
FIG. 5 shows a step of forming seed blocks on the sacrificial layer of FIG. 4.
Figure 6:
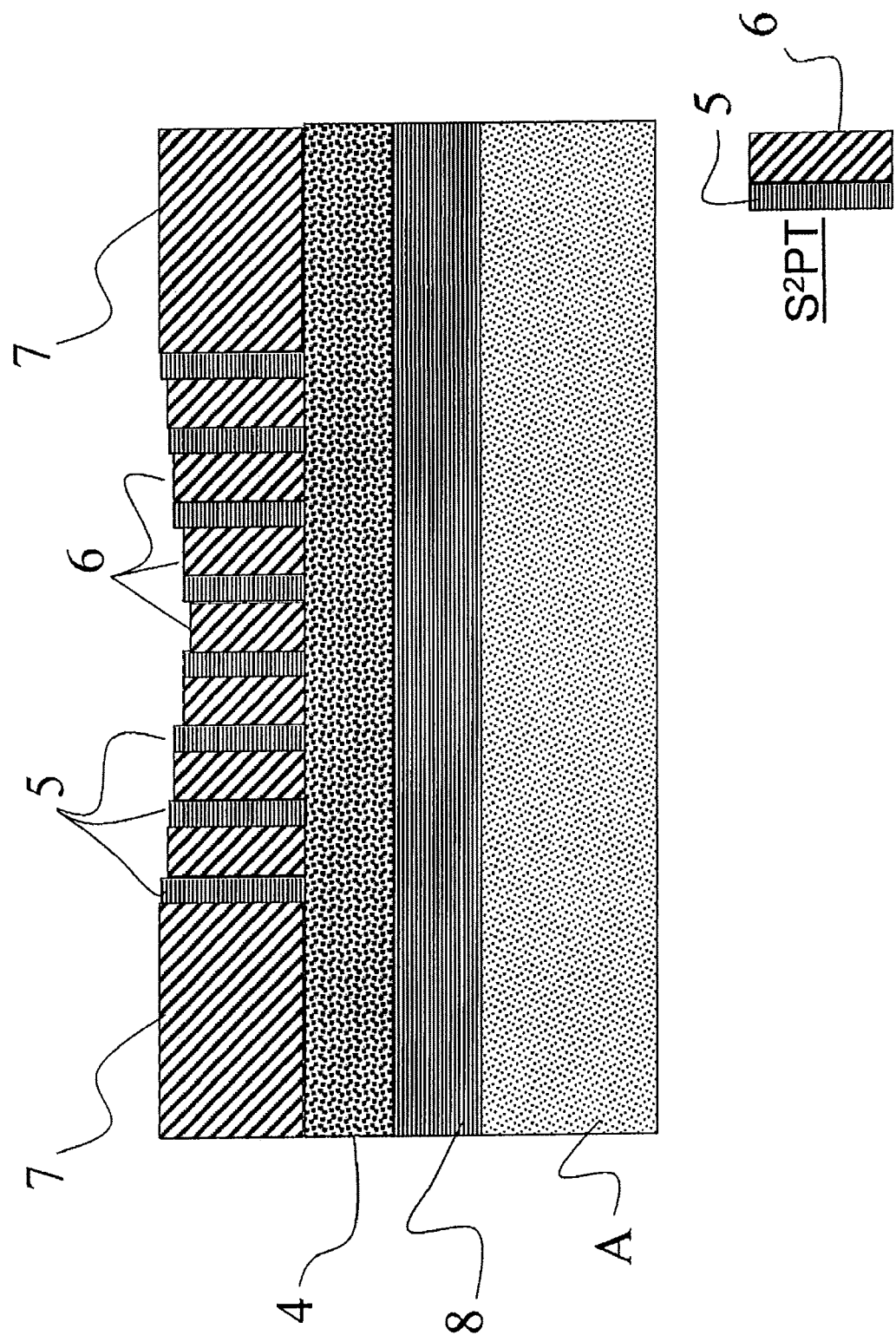
FIG. 6 shows a step of forming first and second mask spacers from the seed blocks of FIG. 5.
Figure 7:
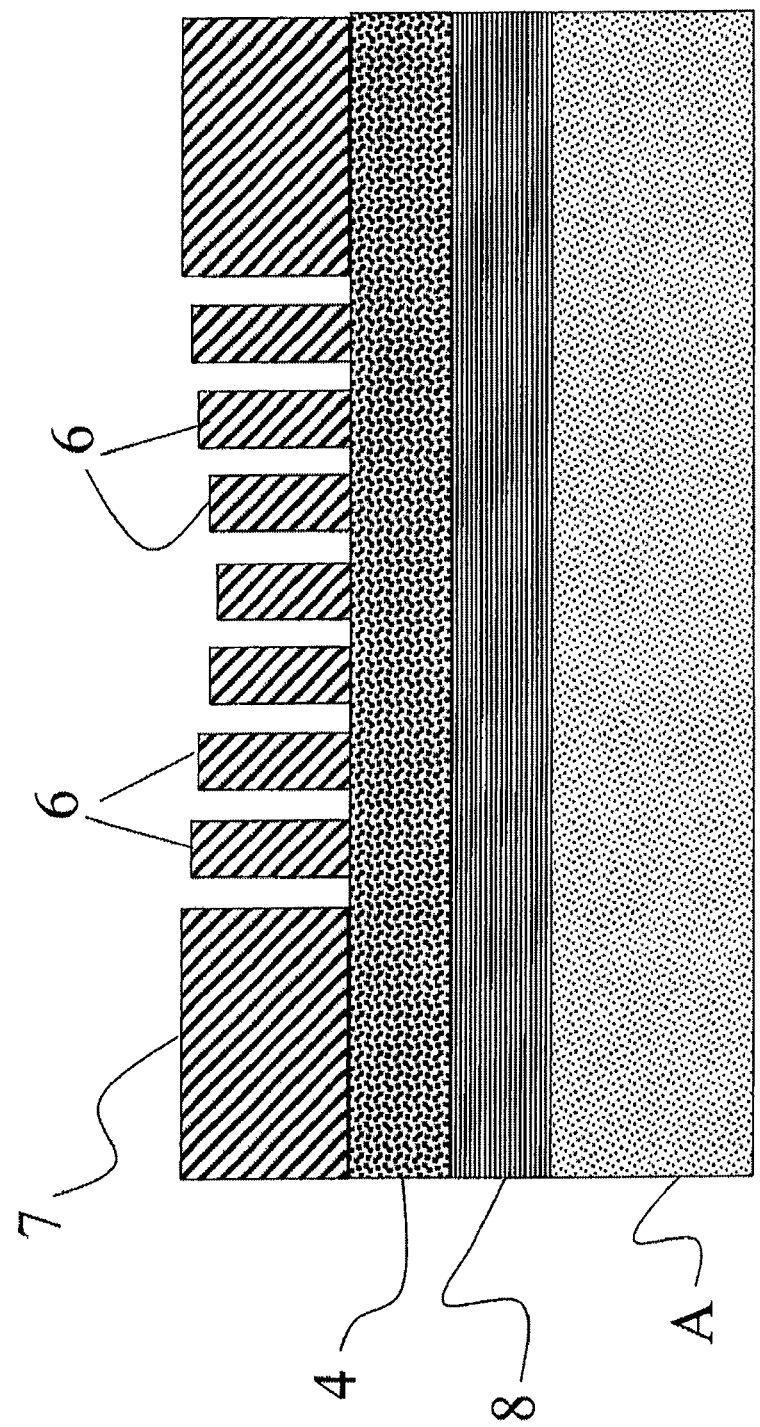
FIG. 7 shows a step of removing the first mask spacers of FIG. 6.
Figure 8:
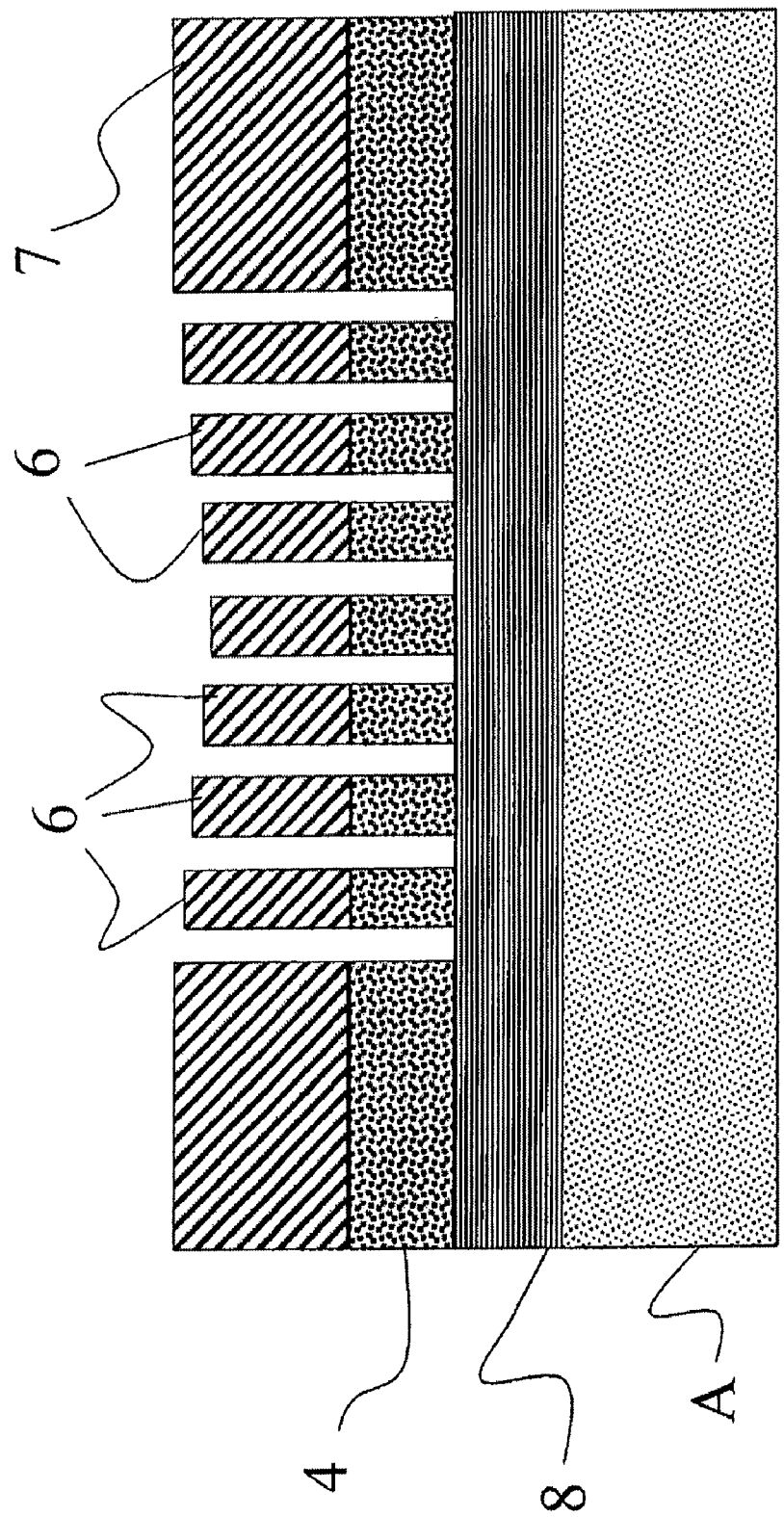
FIG. 8 shows a step of selectively etching portions of the sacrificial layer of not covered by the second mask spacers of FIG. 7.
Figure 9:
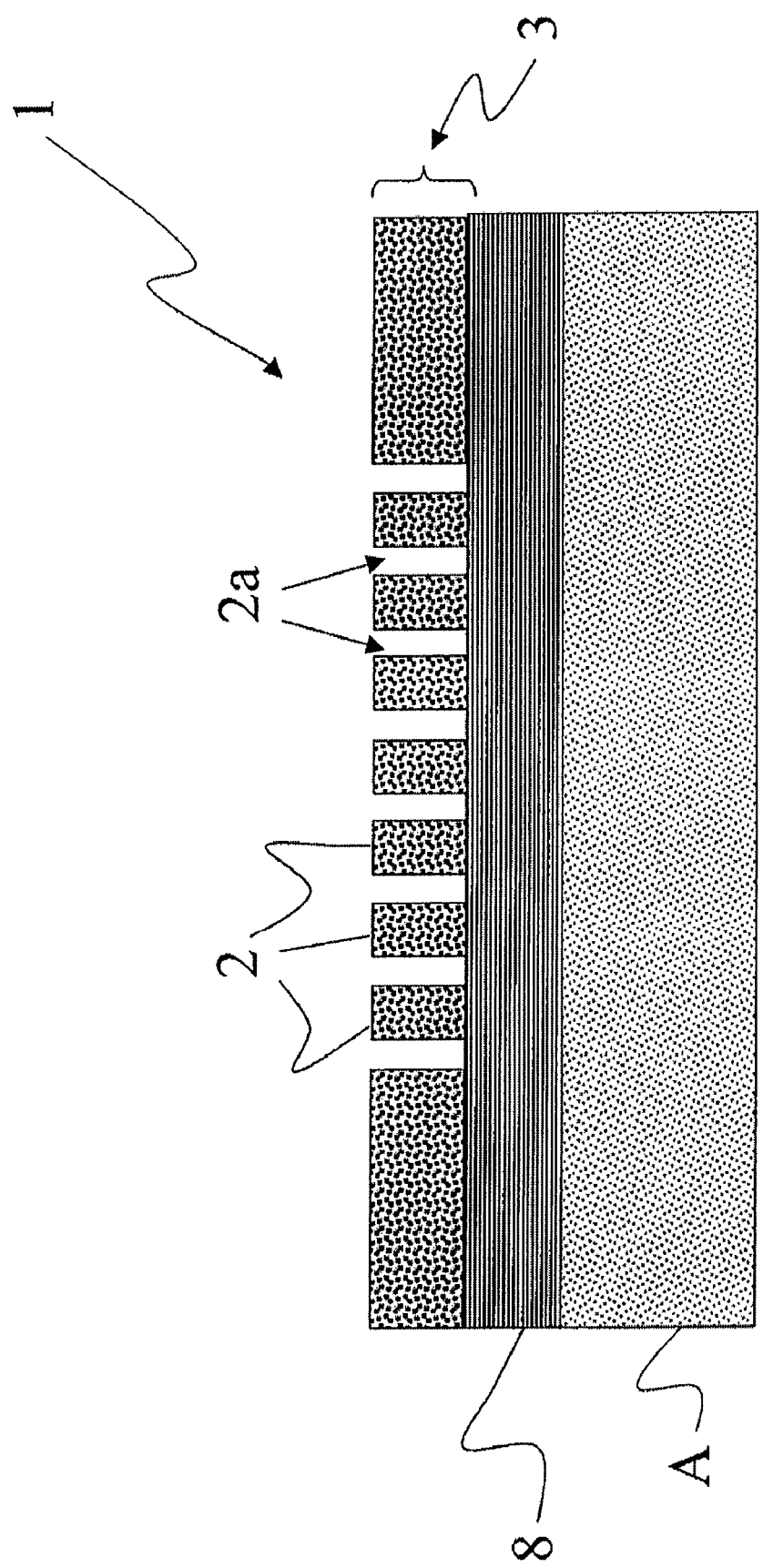
FIG. 9 shows a step of removing the second mask spacers and the seed blocks of FIG. 8.
Figure 10:
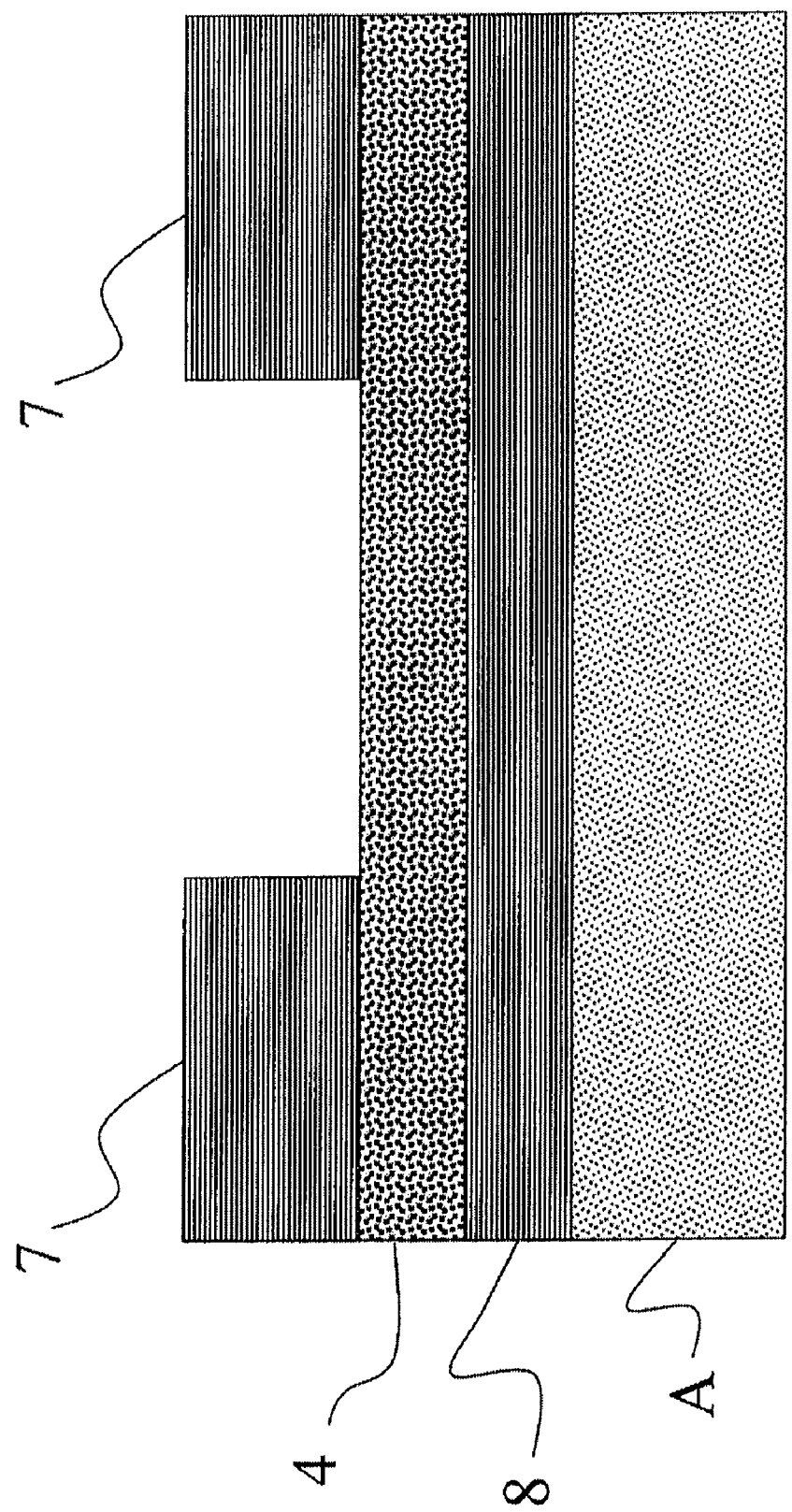
FIG. 10 shows a step of the present method according to a further embodiment of the invention.
Figure 11:
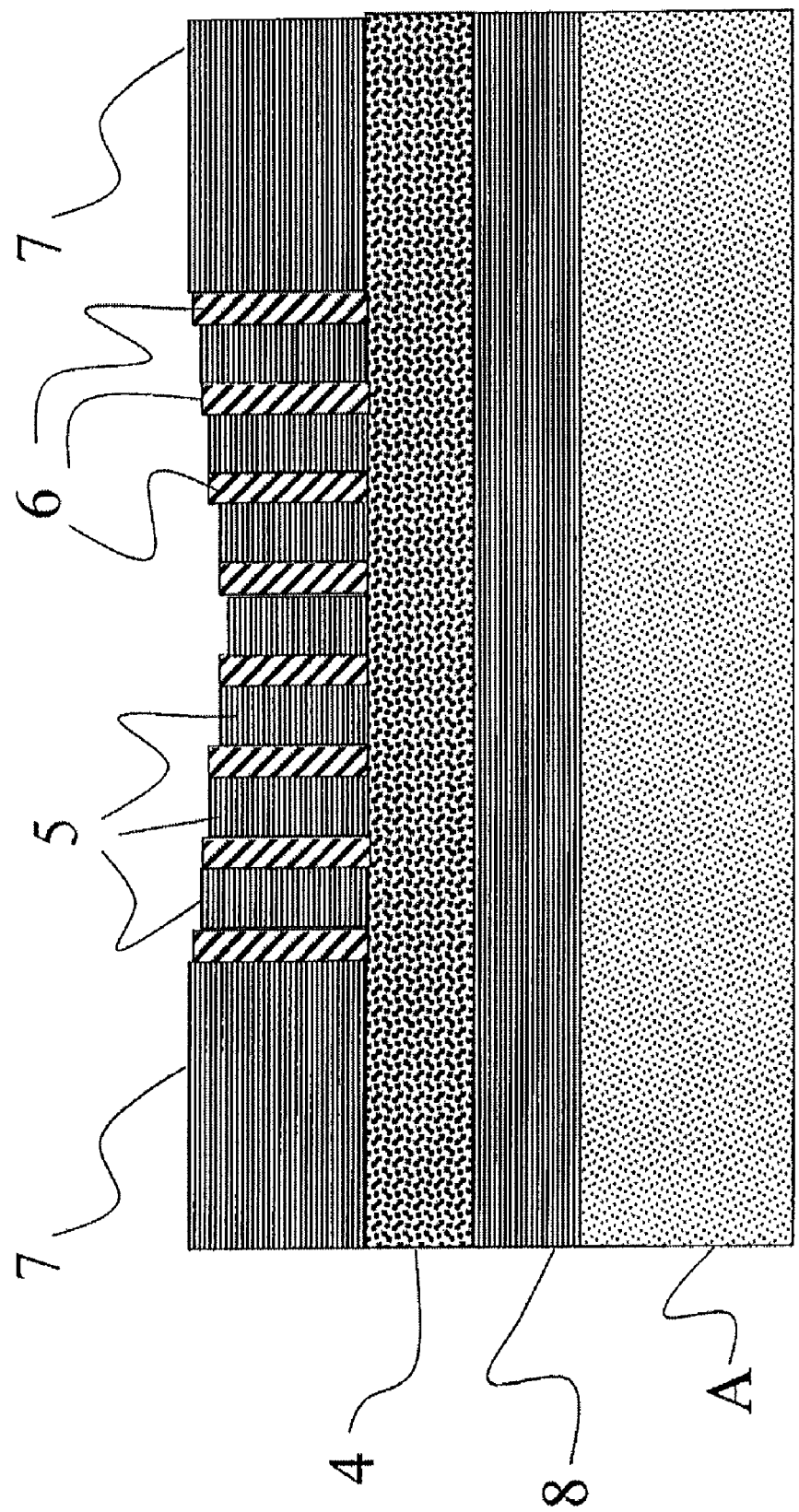
FIG. 11 shows another step of the present method according to the further embodiment of the invention.
Figure 12:
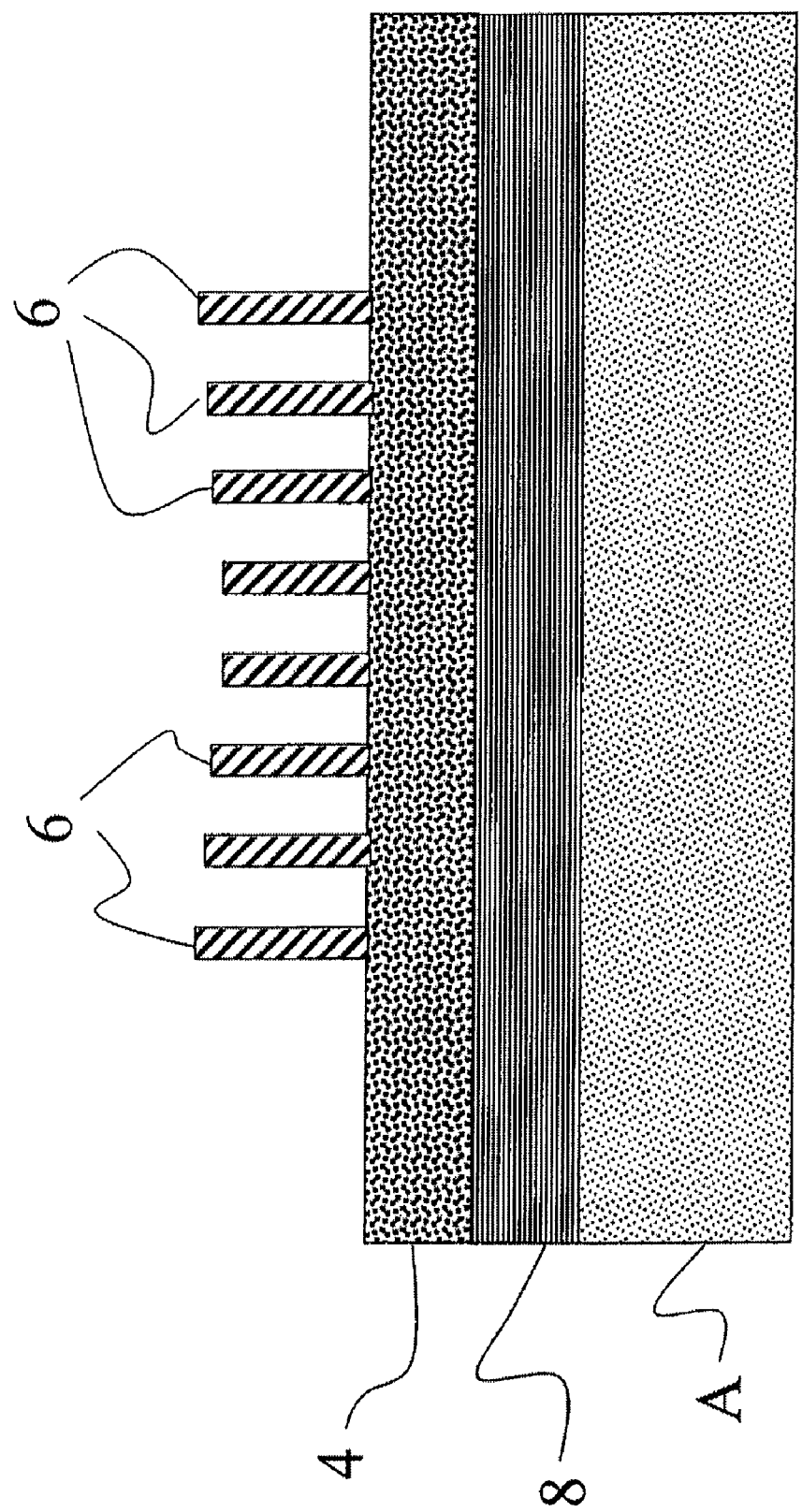
FIG. 12 shows another step of the present method according to the further embodiment of the invention.
Figure 13:
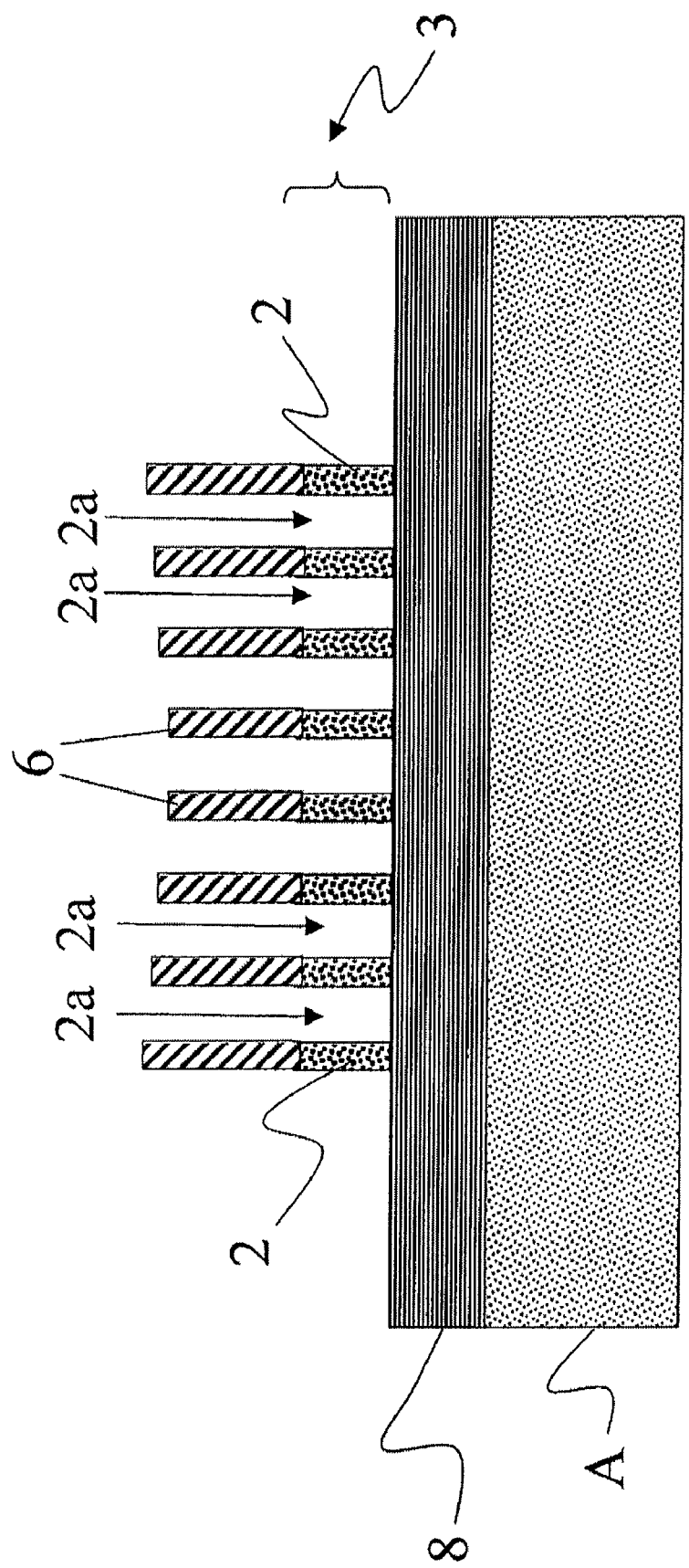
FIG. 13 shows another step of the present method according to the further embodiment of the invention.
Figure 16A:
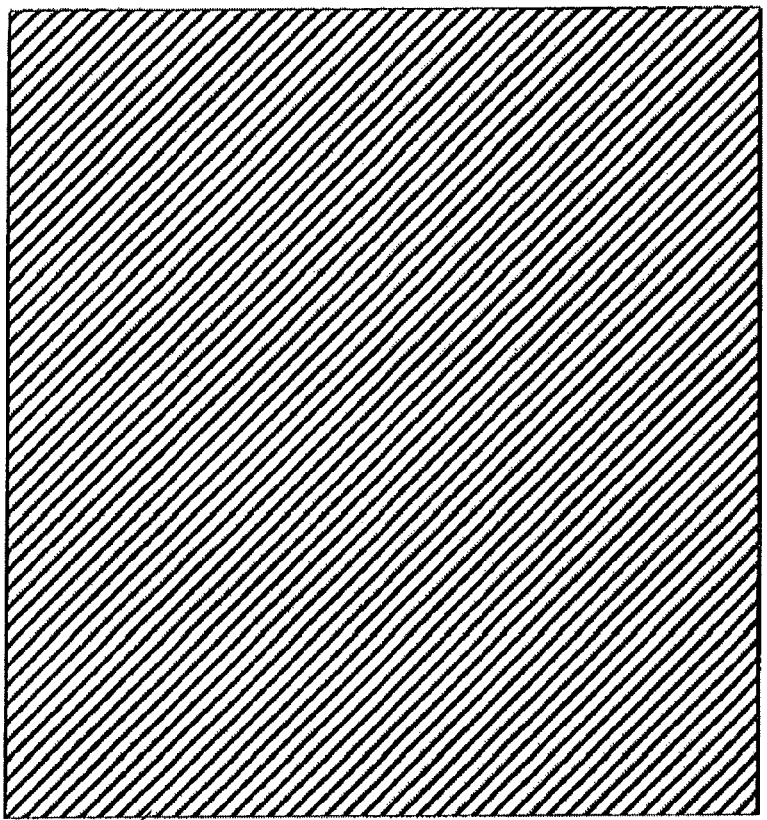
FIG. 16A shows a plan view of a pattern layer realized on the first insulating layer of FIG. 15A.
Figure 16B:
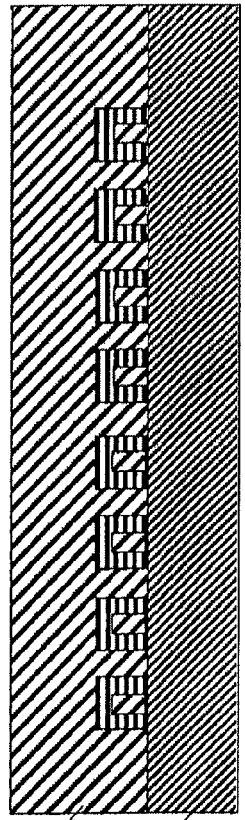
FIG. 16B shows a section view of the pattern layer of FIG. 16A.
Figure 17A:
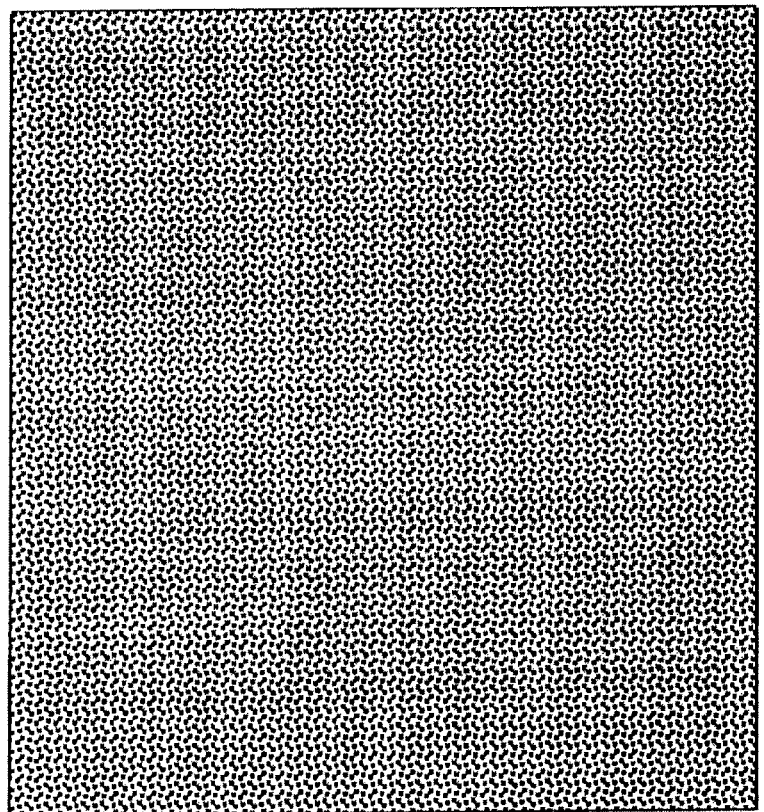
FIG. 17A shows a plan view of a third insulating layer realized on the pattern layer of FIG. 16A.
Figure 17B:
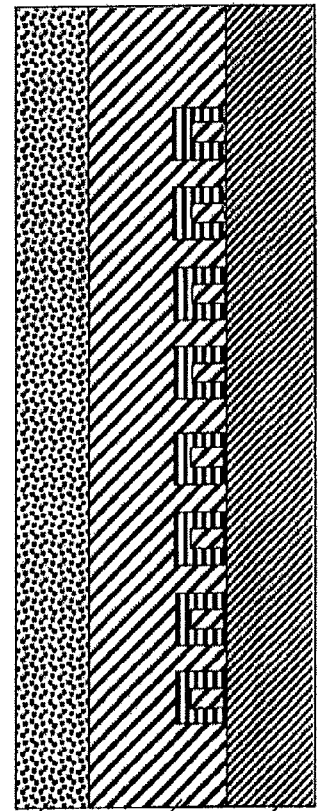
FIG. 17B shows a section view of the third insulating layer of FIG. 17A.
Figure 18A:
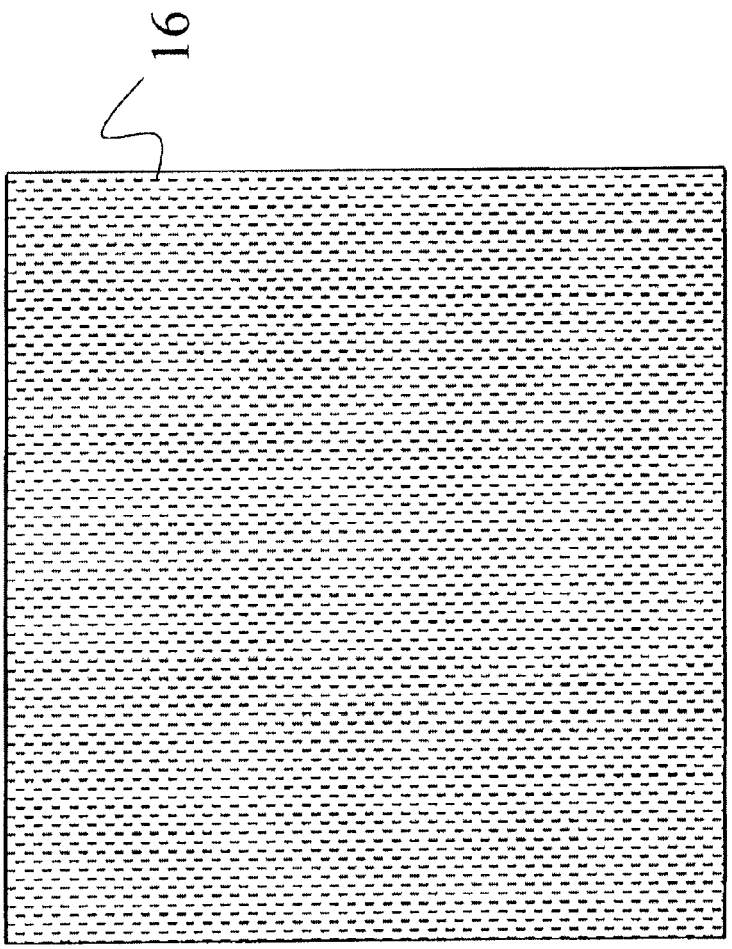
FIG. 18A shows a plan view of a mask layer realized on the third insulating layer of FIG. 17A.
Figure 18B:
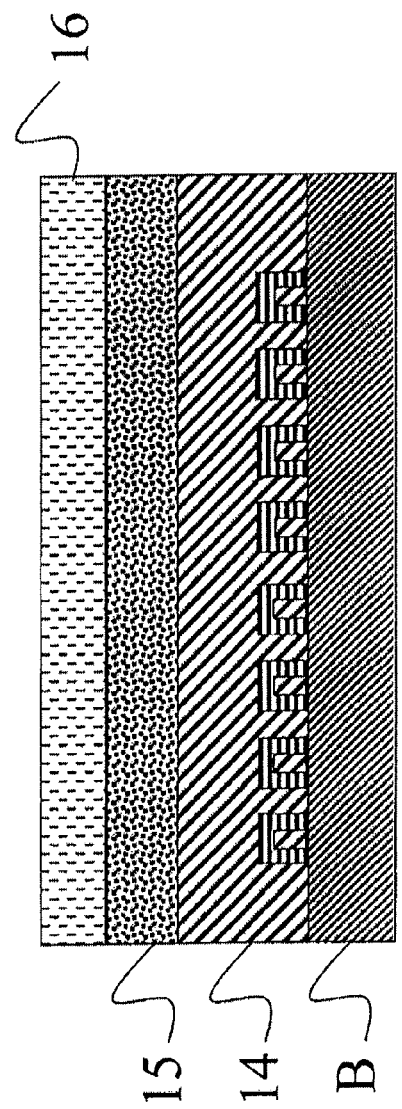
FIG. 18B shows a section view of the mask layer of FIG. 18A.

Advantageously, also the seed-blocks 7 are realized in one of these two different materials chosen among silicon oxide and polysilicon as shown with particular reference to the examples of FIG. 5 and of FIG. 10.

According to a preferred embodiment, the method provides the realization of a bottom layer 8, interposed between the substrate A and the sacrificial layer 4 and realized in a second material.

This bottom layer 8, preferably a layer of silicon oxide of 100 nm thermally grown on the substrate A, avoids a possible undesired chemical etching of the same substrate A, which could occur during one of the above selective removal steps, in particular in case the substrate A is of silicon and one of the two different materials of the mask spacers 5, 6 is polysilicon.

According to the examples reported above for the materials used, the selective removal of the silicon oxide mask spacers 5 is obtained by means of chemical etching with hydrofluoric acid (HF), obtaining the partial exposure of the sacrificial layer 4.

The successive chemical and/or anisotropic selective etching against the sacrificial layer 4, with removal of the exposed portions of silicon nitride and formation of the above slots 2a, is instead carried out with phosphoric acid ($H_3PO_4$).

Finally, the removal of the mask spacers 6 and of the seed-blocks 7 is obtained through chemical etching by a mixture of nitric acid and hydrofluoric acid ($HNO_3$:HF).

The multispacer structure 1 comprises spacers 2 (nanowires) all substantially having the same height and spaced from each other by slots 2a all substantially having the same depth, thereby being particularly indicated to be used both directly as circuit structure and as portion of more complex circuit architectures.

The multispacer structure 1 being realized with high resolution is also particularly indicated to be used as a mold in imprint lithography processes.

In particular, the use of the multispacer structure 1 as a mold is advantageous in nanometric imprint lithographic processes (NIL) wherein a predetermined topography of the mold (pattern) is used to define, through imprint, the topography or pattern on a substrate.

The imprint is obtained through the mechanical deformation of a suitable resin (resist) which is used as mask on the substrate.

It is thus possible, by the method described above, to obtain multispacer structures particularly indicated to be used as a mold in imprint lithography processes in the realization of repetitive circuit architectures.

According to one embodiment of the invention, the multispacer structure 1 can be used as a mold also in further processes made available by the prior art to realize circuit architectures, such as for example a SNAP process (Super-lattice nanowire pattern).

It is also to be added that, according to further embodiments of the invention, it is possible, by the present method, realizing multispacer structures (molds) comprising spacers of different shape with respect to those shown by way of example in the figures, for example spacers with elbow-like portions being L or C-like shaped.

Naturally, also the slots of these multispacer structures (or recesses of the mold) will have an L or C-like shape. To the purpose, it will be enough that the seed or the seeds from which the mask spacers are obtained through S"PT have a substantially T or I-like shape.

Similar seeds are shown in the patent application PCT/IT2005/000110 filed on Feb. 28, 2005 to the same Applicant and herein incorporated by reference.

An example of a circuit architecture realized through imprint lithography, by use of the multispacer structure 1 as mold, is now described with reference to FIGS. 14A-25E.

In particular the steps of a method according to one embodiment to realize a crossbar circuit architecture, globally indicated with 10, are described.

To obtain a crossbar architecture 10 first, on a substrate B, a plurality of conductive spacers is realized, these latter being also indicated as nanowires 11, arranged in parallel to one another to realize a first array 12 of nanowires.

In particular, the first array 12 of nanowires is realized in a per se known way through imprint lithography by using the mold 1, or according to the method previously described with reference to the realization of the above multispacer structure.

Then, above the nanowires 11, a first insulating layer 13 of predetermined limited thickness is realized, for example a layer obtained through thermal oxidation of the nanowires 11.

As shown in FIG. 15A and successive ones, this oxidation is limited to the nanowires 11, advantageously realized in polysilicon, the possibility of obtaining an oxidation extended to the whole underlying topography being however not excluded, i.e., a first insulating layer 13 extended above the whole substrate B.

This latter case occurs, in particular, when the substrate B is realized, for example, in silicon, which is also liable to undergo a thermal oxidation like the polysilicon of the nanowires 11.

At this point, above the current topography a pattern layer 14 is realized, preferably a polysilicon conductive layer.

As shown in FIGS. 16A-D, this pattern layer 14 is obtained with a uniform and substantially flat upper surface further, for example, to a conventional planarization step.

Above the pattern layer 14 a mask layer 16 is then realized. This mask layer can be realized with any resin of the known type suitable to be used in an imprint lithography process and it can consist, for example, of a resist layer.

Thus, similarly to the realization of the above first array 12, the mold 1 is used to obtain, by imprint lithography and from the pattern layer 14, a second array 17 comprising a plurality of nanowires 18 substantially perpendicular to the nanowires 11 of the first array 12, as it will be more apparent hereafter in the description.

In detail, through the imprint lithography first, further to an imprint step of the mask layer 16, a plurality of first mask spacers 19 arranged in a direction substantially perpendicular to the nanowires 11 are obtained.

The imprint step stands for a conventional step through which the imprint of the mold 1 is transferred onto the resist layer 16, for example with the help of the temperature and/or the pressure and/or irradiation, and then the "imprinted" resist portion is removed.

Further to this removal, above the pattern layer 14, the above plurality of first mask spacers 19 is obtained, which substantially have the same shape as that of the slots 2a of the multispacer structure here indicated also as recesses of the mold 1, in the examples of the figures a substantially bar-like shape.

The removal of the "imprinted" resist portion partially exposes the pattern layer 14, which, after a chemical and/or anisotropic selective etching step against the conductive material of the same pattern layer 14, is removed in the portions not protected by the first mask spacers 19.

The successive removal of the first mask spacers 19 of resist exposes a second plurality of conductive spacers 18, which realize the above nanowires of the second array 17.

In particular, the conductive nanowires 18 being parallel to each other, realize the second array 17 of nanowires which is separated and insulated from the first array 12 of nanowires through the above first insulating layer 13.

More in particular, the nanowires 11 and 18 of the first and of the second array which are substantially perpendicular to each other and lie on parallel planes, determine a plurality of crossing points 21.

Naturally, to obtain, in the same architecture, further arrays of nanowires arranged on growing planes, repeating the above described steps is enough.

Without being limited for this reason, the circuit architecture according to one embodiment of the invention is here illustrated and in the examples of the figures shown, as a crossbar architecture comprising two arrays of nanowires.

At this point, a quick thermal oxidation step is carried out with realization, above the nanowires 18 of the second array 17, of a thin silicon oxide layer identified as second insulator layer 22, as shown in FIGS. 24A-E.

The crossbar architecture 10 is then obtained through a chemical etching with acid aqueous solution further to which the exposed oxide layers are removed, in particular the second insulating layer 22 and the first insulating layer 13, this latter only partially since a limited portion thereof comprised between the nanowires 11, 18 respectively of the first and of the second array 12, 17, as shown in FIGS. 25A-E, is not removed.

In this way, in correspondence with the crossing points 21, the nanowires 11 and the nanowires 18 extend peripherally beyond the residual oxide layer of the first insulation layer 13, so as to realize a substantially rectangular section recess 23.

According to a preferred embodiment, the method provides the realization of a further insulating layer, here identified as third insulating layer 15, interposed between the pattern layer 14 and the mask layer 16.

The third insulating layer 15, for example a silicon nitride layer (hardmask layer) advantageously allows to obtain, with extreme definition, the nanowires 18 of the second array 17.

In practice going on like this first, further to the obtainment of the first mask spacers 19, the partial exposure of the third insulating layer 15 occurs.

A chemical and/or anisotropic selective etching against the same third insulating layer 15 then determines the removal of its portions not protected by the first mask spacers 19.

In this way the underlying pattern layer 14 is partially exposed while the remaining portion of third insulating layer 15 realizes second mask insulating spacers 20 (hardmask spacers). The first mask spacers 19 of resist are instead removed.

At this point, similarly to what has been previously described, a further chemical and/or anisotropic etching, this time selective with respect to the pattern layer 14, removes the portions not protected by the second mask spacers 20, which are subsequently removed through selective chemical etching against the silicon nitride, with obtainment of the plurality of nanowires 18 of the second array 17. The method is then completed by the above described steps.

It is also to be added that, in a similar way to what now described for the third insulating layer 15, a silicon nitride layer for the obtainment of hardmask spacers can be used also for the realization of the first array 12 of nanowires 13, and possibly for the realization of further arrays.

As regards the layers of insulating material and of conductive material, realized in some of the steps of the method described above, it is to be said that they can be obtained through several controlled deposition techniques known in the prior art.

It is possible, for example, realizing a layer by atomic deposition or with the "Molecular Beam Epitaxy" (MBE). Or, particularly for the oxide layers, by "CVD oxide" (Control Vapor Deposition) or even, as previously described, with "Thermal Oxidation" technique.

The thickness of these layers first depends on the technique used for their realization, in any case, layers are realized having a thickness comprised between 1 and 100 nm, preferably between 5 and 60 nm, even better between 10 and 30 nm.

The main advantage of the method described above is that of obtaining, with high resolution, a nanometric multispacer structure, and i.e., a structure comprising spacers and slots of high regularity.

Such a structure, as previously underlined, is thus particularly suitable both to be used directly as circuit structure or as portion of more complex circuit architectures, and to be used as a mold in imprint lithography processes or in other types of processes which use similar molds for the realization of further circuit architectures.

Advantageously, the nanometric circuit architectures thus obtained will be provided with high resolution and high regularity, like the mold used in their realization.

Still advantageously, the method described above is particularly economic and simple to realize, besides being of quick execution.

Thanks to the use, as mold, of the multispacer structure 1 it is also possible to realize nanometric circuit architectures on a large scale, conveniently allowing the production, on an industrial level, of integrated circuits comprising these architectures.

Obviously, in order to meet contingent and specific requirements, a skilled in the art could bring several modifications to the above described invention, all however comprised within the scope of protection of the invention, as defined by the following claims.

All of the above U.S. patents, U.S. patent application publications, U.S. patent applications, foreign patents, foreign patent applications and non-patent publications referred to in this specification are incorporated herein by reference, in their entirety.

The invention claimed is:

1. A method of forming a nanowire structure, comprising:
   realizing, on a substrate, a sacrificial layer;
   realizing, on said sacrificial layer, a sequence of mask spacers obtained by a multispacer patterning technique, said mask spacers including first mask spacers of a first material alternating with second mask spacers of a second material that is different than the first material;
   obtaining exposed portions of the sacrificial layer by etching and removing the first mask spacers of the first material;
   selectively etching said sacrificial layer with selective removal of the exposed portions of said sacrificial layer;
   etching and removing the second mask spacers of the second material, thereby obtaining a multispacer structure; and
   forming a plurality of nanowires by using the multispacer structure as a mold.

2. A method according to claim 1 wherein the forming steps forms a superlattice nanowire pattern.

3. A method according to claim 1, wherein said first and second materials include silicon oxide and polysilicon.

4. A method according to claim 1, wherein said mask spacers have a width comprised between 1 and 100 nm.

5. A method according to claim 1, wherein said sacrificial layer is silicon nitride.

6. A method according to claim 1, further comprising realizing a bottom layer of a third material interposed between said substrate and said sacrificial layer.

7. A method according to claim 6, wherein said third material is silicon oxide.

8. A method according to claim 1, wherein said multispacer structure comprises slots having substantially the same depth.

9. A method for realizing a nanometric crossbar circuit architecture, comprising:
   providing, on a substrate, a first array of nanowires;
   realizing, on said first array of nanowires, a first insulating layer;
   realizing a first pattern layer on said first insulating layer and a first mask layer on the pattern layer;
   realizing, on said mask layer, a first sacrificial layer;
   realizing, on said sacrificial layer, a first sequence of mask spacers obtained by a multispacer patterning technique, said mask spacers including first mask spacers of a first material alternating with second mask spacers of a second material that is different than the first material;
   obtaining exposed portions of the sacrificial layer by etching and removing the first mask spacers of the first material;
   selectively etching said sacrificial layer with selective removal of the exposed portions of said sacrificial layer;
   etching and removing the second mask spacers of the second material, thereby obtaining a first multispacer structure formed by remaining portions of the sacrificial layer;
   performing imprint lithography, using said multispacer structure as a mold, to realize, from said mask layer, a plurality of third mask spacers arranged in direction substantially perpendicular to said nanowires, said pattern layer having exposed portions between the third mask spacers;
   selectively removing the exposed portions of the pattern layer by selectively etching said pattern layer; and
   selectively removing said third mask spacers and obtaining a second array of nanowires, said nanowires of said second array being arranged substantially perpendicular to said nanowires of said first array with determination of a plurality of crossing points.

10. A method according to claim 9, further comprising:
    realizing, above said second array of nanowires, a second insulating layer; and
    etching and removing said insulating layers except for limited portions of the first insulating layer, thereby realizing, in correspondence with said crossing points, respective recesses.

11. A method according to claim 9, further comprising:
    providing a second insulating layer interposed between said substrate and said mask layer; and
    realizing fourth mask spacers by selectively etching the third insulating layer using the multispacer structure as a mold.

12. A method according to claim 11, further comprising exposing said crossbar circuit architecture to a treatment with silicon hydride.

13. A method according to claim 9, further comprising:
    forming k additional masking and pattern layers; and
    repeating k times the steps of performing imprint lithography, selectively removing the exposed portions of the additional pattern layer, and selectively removing said third mask spacers to realize further k arrays of nanowires wherein nanowires of consecutive arrays are substantially perpendicular to each other.

14. A method according to claim 9, wherein said pattern layer is obtained with a uniform and substantially flat upper surface by a planarization step.

15. A method according to claim 9, wherein providing said first array of nanowires includes:
    realizing a second pattern layer on said substrate;
    realizing, on said second pattern layer, a second sequence of mask spacers obtained by a multi-spacer patterning technique, said mask spacers of said second sequence including fourth mask spacers of the first material alternating with fifth mask spacers of the second material;
    obtaining exposed portions of the second pattern layer by etching and removing the fourth mask spacers;
    selectively etching said second pattern layer with selective removal of the exposed portions of said second pattern layer;
    etching and removing the fifth mask spacers, thereby leaving the first array of nanowires formed from the second pattern layer.

16. A method according to claim 9, wherein providing said first array of nanowires includes:
    realizing a second pattern layer on said substrate and a second mask layer on the second pattern layer;
    realizing, on said second mask layer, a second sacrificial layer;
    realizing, on said second sacrificial layer, a second sequence of mask spacers obtained by a multi-spacer patterning technique, said mask spacers of said second sequence including fourth mask spacers of the first material alternating with fifth mask spacers of the second material;
    obtaining exposed portions of the second sacrificial layer by etching and removing the fourth mask spacers;
    selectively etching said second sacrificial layer with selective removal of the exposed portions of said second sacrificial layer;

etching and removing the fifth mask spacers, thereby obtaining a second multispacer structure formed by remaining portions of the second sacrificial layer;
performing imprint lithography, using said second multispacer structure as a mold, to realize, from said second mask layer, a plurality of sixth mask spacers, said second pattern layer having exposed portions between the sixth mask spacers;
selectively removing the exposed portions of the second pattern layer by selectively etching said second pattern layer; and
selectively removing said sixth mask spacers, thereby leaving the first array of nanowires formed from the second pattern layer.

17. A method, comprising:
obtaining a multispacer structure by a multispacer patterning process, the multispacer structure having a plurality of spacers separated from one another by a plurality of openings; and
forming a plurality of conductive nanostructures by using the multispacer structure as a mold, wherein obtaining includes:
realizing, on a substrate, a sacrificial layer;
realizing, on said sacrificial layer, a sequence of mask spacers obtained by the multispacer patterning process, said mask spacers including first mask spacers of a first material alternating with second mask spacers of a second material that is different than the first material;
obtaining exposed portions of the sacrificial layer by etching and removing the first mask spacers of the first material;
selectively etching said sacrificial layer with selective removal of the exposed portions of said sacrificial layer, the plurality of spacers of the multispacer structure being portions of the sacrificial layer remaining after the selective removal of the exposed portions of said sacrificial layer; and
etching and removing the second mask spacers of the second material from the sacrificial layer.

18. A method according to claim 17 wherein the forming step forms a superlattice nanowire pattern.

19. A method according to claim 17, wherein said first and second materials include silicon oxide and polysilicon.

20. A method according to claim 17, wherein said mask spacers have a width comprised between 1 and 100 nm.

21. A method according to claim 17, wherein said sacrificial layer is silicon nitride.

22. A method according to claim 17, wherein the obtaining includes realizing a bottom layer of a third material interposed between said substrate and said sacrificial layer.

23. A method according to claim 22, wherein said third material is silicon oxide.

24. A method according to claim 17, wherein the openings of said multispacer structure comprise slots having substantially the same depth.

* * * * *